US010256074B2

(12) United States Patent
Yamada et al.

(10) Patent No.: US 10,256,074 B2
(45) Date of Patent: *Apr. 9, 2019

(54) EXPOSURE APPARATUS AND EXPOSURE METHOD

(71) Applicant: INTEL CORPORATION, Santa Clara, CA (US)

(72) Inventors: Akio Yamada, Saitama (JP); Shinji Sugatani, Saitama (JP); Masaki Kurokawa, Saitama (JP); Masahiro Seyama, Saitama (JP)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/671,112

(22) Filed: Aug. 7, 2017

(65) Prior Publication Data

US 2017/0358426 A1 Dec. 14, 2017

Related U.S. Application Data

(63) Continuation of application No. 14/883,634, filed on Oct. 15, 2015, now Pat. No. 9,734,988.

(30) Foreign Application Priority Data

Dec. 24, 2014 (JP) .................................. 2014-260001

(51) Int. Cl.
*H01J 37/04* (2006.01)
*H01J 37/317* (2006.01)

(52) U.S. Cl.
CPC ........ *H01J 37/3174* (2013.01); *H01J 37/045* (2013.01); *H01J 37/3177* (2013.01);
(Continued)

(58) Field of Classification Search
CPC .. H01J 37/3174; H01J 37/045; H01J 37/3177; H01J 2237/31766
(Continued)

(56) References Cited

U.S. PATENT DOCUMENTS 5,260,579 A * 11/1993 Yasuda .................. B82Y 10/00
250/398
7,276,714 B2 10/2007 Platzgummer et al.
(Continued)

FOREIGN PATENT DOCUMENTS

EP 0794552 A2 9/1997
JP S63186428 A 8/1988
(Continued)

OTHER PUBLICATIONS

Office Action issued for counterpart European Patent Application No. 15 189 949.9, issued by the European Patent Office dated Jan. 19, 2018.
(Continued)

*Primary Examiner* — Nicole M Ippolito
*Assistant Examiner* — Hanway Chang

(57) ABSTRACT

To form a complex and fine pattern by combining optical exposure technology and charged particle beam exposure technology, provided is an exposure apparatus that radiates a charged particle beam at a position corresponding to a line pattern on a sample, including a beam generating section that generates a plurality of the charged particle beams at different irradiation positions in a width direction of the line pattern; a scanning control section that performs scanning with the irradiation positions of the charged particle beams along a longitudinal direction of the line pattern; a selecting section that selects at least one charged particle beam to irradiate the sample from among the plurality of charged particle beams, at a designated irradiation position in the
(Continued)

longitudinal direction of the line pattern; and an irradiation control section that controls the at least one selected charged particle beam to irradiate the sample.

17 Claims, 15 Drawing Sheets

(52) U.S. Cl.
CPC ............... *H01J 2237/31761* (2013.01); *H01J 2237/31766* (2013.01); *H01J 2237/31774* (2013.01)

(58) Field of Classification Search
USPC ............................... 250/492.1, 492.2, 492.3
See application file for complete search history.

(56) References Cited

U.S. PATENT DOCUMENTS

| | | | |
|---|---|---|---|
| 9,734,988 B2 * | 8/2017 | Yamada | ............... H01J 37/3174 |
| 2009/0200495 A1 | 8/2009 | Platzgummer | |
| 2013/0011796 A1 | 1/2013 | Hirata | |
| 2013/0082187 A1 | 4/2013 | Ogasawara | |
| 2013/0164692 A1 | 6/2013 | Kotoku | |
| 2013/0196517 A1 | 8/2013 | Tsujita et al. | |
| 2015/0243480 A1 | 8/2015 | Yamada | |

FOREIGN PATENT DOCUMENTS

| | | |
|---|---|---|
| JP | H05166707 A | 7/1993 |
| WO | 2015191104 A1 | 12/2015 |

OTHER PUBLICATIONS

Office Action issued for counterpart Chinese Application 201510673307.2, issued by the Chinese Intellectual Property Office dated Feb. 6, 2018.
Office Action issued for counterpart Taiwanese Application 104133390, issued by Taiwan Intellectual Property Office dated Nov. 8, 2016.
Office Action issued for counterpart Korean Application 10-2015-0144061, issued by Korean Intellectual Property Office dated Aug. 10, 2016.
The extended European search report issued for counterpart European Application 15189949.9, issued by European Patent Office dated Sep. 20, 2016.
Partial European search report for European Application No. 15189949.9, issued by the European Patent Office dated Apr. 28, 2016.
Notice of First Office Action for Patent Application No. 201510673307.2, issued by the State Intellectual Property Office of the People's Republic of China dated May 16, 2017.
U.S. Appl. No. 14/883,634, filed Oct. 15, 2015.
Office Action issued for counterpart Japanese Application No. 2014-260001, drafted by the Japan Patent Office dated Aug. 15, 2018.
Office Action issued for counterpart Japanese Application No. 2014-260001, drafted by the Japan Patent Office dated Jan. 15, 2019.

* cited by examiner

EXPOSURE APPARATUS AND EXPOSURE METHOD

CROSS-REFERENCE TO RELATED APPLICATIONS

This application is a continuation of U.S. patent application Ser. No. 14/883,634, filed on Oct. 15, 2015, which claims priority to Japanese Patent Application No. 2014-260001, filed on Dec. 24, 2014, the contents of each of which are hereby incorporated herein by reference in their entirety.

BACKGROUND

1. Technical Field

The present invention relates to an exposure apparatus and an exposure method.

2. Related Art

Conventionally, complementary lithography is known for forming a fine wire pattern by performing machining of a simple line pattern formed by optical exposure technology with a line width of tens of nanometers, using a charged particle beam such as an electron beam, as shown in Patent Documents 1 and 2, for example. Furthermore, a multi-beam exposure technique is known using a plurality of charged particle beams, as shown in Patent Documents 3 and 4, for example.
Patent Document 1: Japanese Patent Application Publication No. 2013-16744
Patent Document 2: Japanese Patent Application Publication No. 2013-157547
Patent Document 3: U.S. Pat. No. 7,276,714
Patent Document 4: Japanese Patent Application Publication No. 2013-93566

However, with such techniques, when using multi-beam exposure in which a plurality of charged particle beams are radiated on a pattern, it is difficult to machine line patterns formed with different line widths and different pitches using these beams. On the other hand, there are cases where the semiconductor device to be manufactured cannot be realized simply by machining a simple line pattern having uniform line width and uniform pitch, and therefore technology is desired that enables machining of a line pattern formed with different line widths and different pitches.

SUMMARY

Therefore, it is an object of an aspect of the innovations herein to provide an exposure apparatus and an exposure method, which are capable of overcoming the above drawbacks accompanying the related art. The above and other objects can be achieved by combinations described in the claims. According to a first aspect of the present invention, provided is an exposure apparatus that radiates a charged particle beam at a position corresponding to a line pattern on a sample, comprising a beam generating section that generates a plurality of the charged particle beams at different irradiation positions in a width direction of the line pattern; a scanning control section that performs scanning with the irradiation positions of the charged particle beams along a longitudinal direction of the line pattern; a selecting section that selects at least one charged particle beam to irradiate the sample from among the plurality of charged particle beams, at a designated irradiation position in the longitudinal direction of the line pattern; and an irradiation control section that controls the at least one selected charged particle beam to irradiate the sample.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
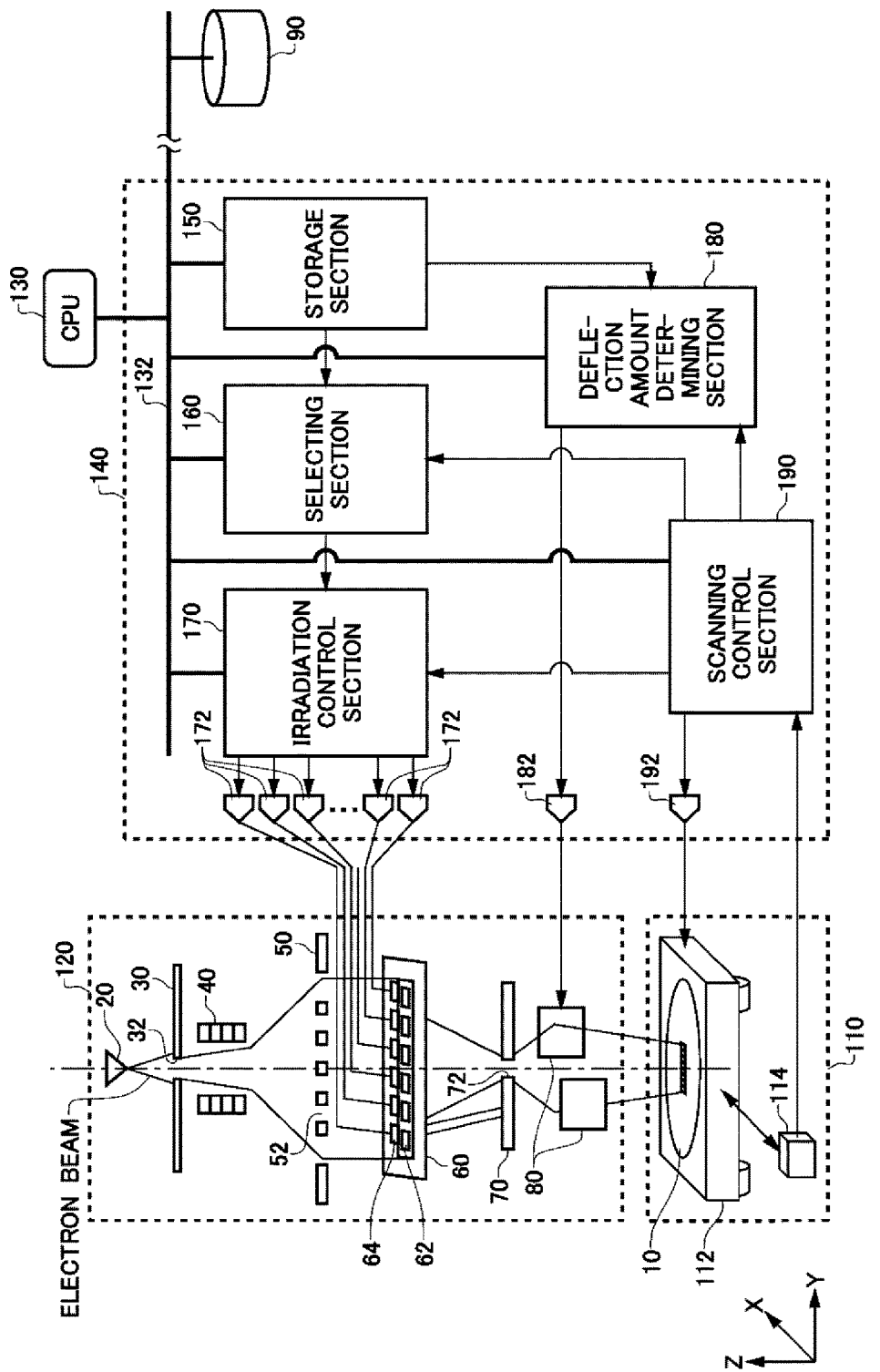
FIG. 1 shows an exemplary configuration of an exposure apparatus 100 according to an embodiment of the present invention.

FIG. 1 shows an exemplary configuration of an exposure apparatus 100 according to an embodiment of the present invention. The exposure apparatus 100 radiates a charged particle beam having an irradiation region corresponding to a predetermined grid at a position corresponding to a line pattern on a sample formed with different line widths and different pitches based on the grid, thereby exposing the line pattern. The exposure apparatus 100 includes a stage section 110, a column section 120, a CPU 130, and an exposure control section 140.

The stage section 110 has the sample 10 mounted thereon and moves the sample 10. The sample 10 may be a substrate formed of a semiconductor, glass, and/or ceramic, for example, and may be a semiconductor wafer formed of silicon, for example. The sample 10 is a substrate having a line pattern made of a conductive body such as metal formed on the surface thereof. The exposure apparatus 100 of the present embodiment exposes a resist formed on the line pattern in order to cleave and finely machine (e.g. form electrodes, wires, and/or vias in) the line pattern.

The stage section 110 includes a stage apparatus 112 and a stage position detecting section 114. The stage apparatus 112 has the sample 10 mounted thereon and moves the sample 10 in the XY plane shown in FIG. 1. The stage apparatus 112 may be an XY stage, or may be a combination including one or more of a Z stage, a rotating stage, and a tilting stage in addition to the XY stage.

The stage apparatus 112 moves in a predetermined direction, which is the longitudinal direction of the line pattern formed on the sample 10. The stage apparatus 112 has the sample 10 mounted thereon such that the longitudinal direction of the line pattern is substantially parallel to the movement direction of the stage, which is the X direction or the Y direction, for example. The present embodiment is an example in which the stage apparatus 112 is an XY stage that moves in both the X direction and the Y direction, and the sample 10 is mounted such that the longitudinal direction of the line pattern is substantially parallel to the X direction, as shown in FIG. 1.

The stage position detecting section 114 detects the position of the stage apparatus 112. The stage position detecting section 114 detects the position of the stage by irradiating the moving stage with laser light and detecting the reflected light, for example. The stage position detecting section 114 preferably detects the position of the stage with an accuracy of approximately 1 nm or better.

The column section 120 irradiates the sample 10 mounted on the stage section 110 with a charged particle beam having electrons and ions. The present embodiment describes an example in which the column section 120 radiates an electron beam. The column section 120 of the present embodiment is a beam generating section that generates a plurality of charged particle beams having different irradiation positions in the width direction of the line pattern formed on the sample 10. The column section 120 includes an electron gun 20, an aperture plate 30, a beam deforming section 40, an aperture array 50, a blanking section 60, a stopping plate 70, and an adjusting section 80.

The electron gun 20 emits electrons using an electric field or heat, and applies a predetermined electric field to the emitted electrons to accelerate the electrons in the direction of the sample 10, which is the −Z direction in FIG. 1, thereby outputting the electron beam. The electron gun 20 may apply a predetermined acceleration voltage, e.g. 50 keV, to output the electron beam. The electron gun 20 may be provided along a vertical line that is parallel to the Z axis from the front surface of the sample 10, which is parallel to the XY plane.

The aperture plate 30 is provided between the electron gun 20 and the sample 10, and blocks a portion of the electron beam emitted by the electron gun 20. The aperture plate 30 has a circular aperture 32, for example, and blocks a portion of the electron beam with the aperture 32 while allowing the remaining portion of the electron beam to pass. The center of the aperture 32 may be formed in a manner to intersect a vertical line connecting the electron gun 20 and the sample 10. In other words, the aperture plate 30 passes an electron beam within a predetermined emission angle range, from within the electron beam emitted from the electron gun 20.

The beam deforming section 40 is provided between the aperture plate 30 and the sample 10, and deforms the substantially circular cross-sectional shape of the electron beam passed by the aperture plate 30. The beam deforming section 40 may be an electron lens such as an electrostatic quadrupole electrode, for example, and deforms the cross-sectional shape of the electron beam in a manner to become an elliptical shape that extends in one direction. In the example of FIG. 1, the beam deforming section 40 deforms the cross-sectional shape of the electron beam in a manner to have a cross-sectional shape that extends in a direction parallel to the Y axis.

The aperture array 50 is provided between the beam deforming section 40 and the sample 10, and blocks a portion of the electron beam having the cross-sectional shape deformed by the beam deforming section 40. The aperture array 50 has a plurality of apertures 52 lined up in one direction, and blocks a portion of the electron beam with these apertures 52 while passing the rest of the electron beam.

In FIG. 1, the apertures 52 are lined up with predetermined intervals therebetween in the direction parallel to the Y axis, and are cut out in a manner to form a plurality of electron beams having cross-sectional shapes that extend in the direction parallel to the Y axis. The aperture array 50 receives the electron beam input thereto and outputs a resulting electron beam group (referred to as an "array beam" in the present embodiment) in an array corresponding to the apertures 52.

The blanking section 60 is provided between the aperture array 50 and the sample 10, and switches whether each of the plurality of charged particle beams output by the aperture array 50 irradiates the sample 10. Specifically, the blanking section 60 switches whether each beam in the array beam is deflected to have an orientation differing from the direction toward the sample 10. The blanking section 60 includes a plurality of apertures 62 that correspond respectively to the beams in the array beam and are lined up in one direction, and a plurality of blanking electrodes 64 that correspond respectively to the beams in the array beam and apply an electric field within the apertures 62.

In the example of FIG. 1, the apertures 62 are lined up at predetermined intervals in the direction parallel to the Y axis, and each beam of the array beam is passed independently. For example, when voltage is not supplied to a blanking electrode 64, no electric field is applied to the electron beam in the corresponding aperture 62, and therefore the electron beam incident to this aperture 62 is passed in the direction toward the sample 10 without being deflected (this is referred to as a "beam ON" state). Furthermore, when voltage is supplied to a blanking electrode 64, an electric field is generated in the corresponding aperture 62, and therefore the electron beam incident to this aperture 62 is deflected in a direction differing from the direction in which the electron beam travels toward the sample 10 (this is referred to as a "beam OFF" state).

The stopping plate 70 is provided between the blanking section 60 and the sample 10, and blocks the electron beams deflected by the blanking section 60. The stopping plate 70 includes an aperture 72. The aperture 72 may have a substantially elliptical shape or rectangular shape that is extended in one direction, and the center of the aperture 72 may be formed to intersect a straight line connecting the electron gun 20 and the sample 10. In the example of FIG. 1, the aperture 72 has a shape that extends in the direction parallel to the Y axis.

The aperture 72 passes the electron beams that have been passed without being deflected by the blanking section 60, and prevents the progression of electron beams that have been deflected by the blanking section 60. Specifically, the column section 120 combines the blanking section 60 and the stopping plate 70 and controls the voltage supplied to the blanking electrode 64, thereby enabling the column section 120 to switch (blanking operation) whether each electron beam included in the array beams irradiates the sample 10 (the beam ON state) or does not irradiate the sample 10 (the beam OFF state).

The adjusting section 80 is provided between the stopping plate 70 and the sample 10, deflects the plurality of charged particle beams, and adjusts the irradiation position of the array beam irradiating the sample 10. The adjusting section 80 may include a deflector that deflects an electron beam by applying an electric field corresponding to a drive signal input thereto to the electron beam passing therethrough, and may adjust the irradiation position of the array beam by deflecting the array beam. The adjusting section 80 may include one or more electromagnetic coils, and adjust the irradiation position of the array beam by applying a magnetic field to the array beam.

The column section 120 according to the present invention described above generates a plurality of electron beams oriented in a predetermined direction, and switches whether each electron beam irradiates the sample 10. In the column section 120, the orientation direction of each of the plurality of electron beams is determined by the direction in which the beam deforming section 40 deforms the cross-sectional shape of the beam, the arrangement direction of the apertures 52 of the aperture array 50, the arrangement direction of the apertures 62 of the blanking section 60 and of the corresponding blanking electrodes 64, and the like.

When these directions substantially match the width direction of the line pattern, which is orthogonal to the movement direction of the stage apparatus 112, the column section 120 mounts the sample 10 such that the movement direction of the stage apparatus 112 substantially matches the longitudinal direction of the line pattern on the sample 10, and therefore a plurality of electron beams are generated with different irradiation positions in the width direction of the line pattern. The present embodiment describes an example in which the column section 120 radiates the array beam oriented in the Y direction, which is a direction perpendicular to the line pattern that is substantially parallel to the X direction.

The CPU 130 controls the overall operation of the exposure apparatus 100. The CPU 130 may have a function of an input terminal that inputs manipulation instructions from a user. The CPU 130 may be a computer or a work station. The CPU 130 is connected to the exposure control section 140, and controls the exposure operation of the exposure apparatus 100 according to input from the user. For example, the CPU 130 is connected to each component of the exposure control section 140 via a bus 132, and handles control signals and the like.

The exposure control section 140 is connected to the stage section 110 and the column section 120, and controls the stage section 110 and the column section 120 to perform the exposure operation on the sample 10, according to the control signals and the like received from the CPU 130. Furthermore, the exposure control section 140 may be connected to the external storage section 90 via the bus 132, and handle data of patterns stored in the external storage section 90, for example. Instead, the external storage section 90 may be connected directly to the CPU 130. Instead, the exposure control section 140 may include a storage section that stores pattern data or the like therein. The exposure control section 140 includes the storage section 150, a selecting section 160, an irradiation control section 170, a deflection amount determining section 180, and a scanning control section 190.

The storage section 150 stores a cut pattern, which is a pattern for the exposure by the exposure apparatus 100, in order to cut the line pattern formed on the sample 10 and a via pattern, which is a pattern for the exposure by the exposure apparatus 100, in order to form vias in the sample 10. The storage section 150 receives the information concerning the cut pattern and the via pattern from the external storage section 90 and stores this information, for example. The storage section 150 may receive the information concerning the cut pattern and the via pattern input from the user via the CPU 130 and store this information.

The storage section 150 stores configuration information of the sample 10 and configuration information of the line pattern formed on the sample 10. The storage section 150 may store measurement results obtained by performing a measurement in advance as the configuration information, before beginning the exposure operation. For example, the storage section 150 stores, as the configuration information of the sample 10, information concerning sources of positioning error such as contraction (deformation error caused by the manufacturing process), rotational error (caused by transport or the like), warping of the substrate or the like, and height distribution of the sample 10.

Furthermore, the storage section 150 stores, as the configuration information of the line pattern, information relating to misalignment between the irradiation position of the array beam and the position of the line pattern. The storage section 150 preferably sets the configuration information to be configuration information of the sample 10 and configuration information of the line pattern obtained by measuring the sample 10 mounted on the stage apparatus 112. Instead, the storage section 150 may store a past measurement result of the sample 10 or a measurement of another sample in the same batch, for example.

The selecting section 160 is connected to the storage section 150, reads the information of the cut pattern and the via pattern, and identifies the designation of the irradiation positions in the longitudinal direction on the line pattern. The selecting section 160 selects at least one charged particle beam to irradiate the sample 10, from among the plurality of charged particle beams generated by the column section 120, at the designated irradiation positions in the longitudinal direction on the line pattern. The selecting section 160 selects the electron beams to be radiated from within the array beam based on the information of the cut pattern and the via pattern, and provides the irradiation control section 170 with the selection result.

The irradiation control section 170 is connected to the selecting section 160 and receives the selection result of the selecting section 160. The irradiation control section 170 is connected to the column section 120, and performs control in a manner to irradiate the sample 10 with the at least one selected charged particle beam. The irradiation control section 170 supplies the blanking electrodes 64 of the blanking section 60 with a signal for switching between the ON state and the OFF state of the electron beam, via the amplifier 172. The amplifier 172 may include an amplification circuit that has a predetermined amplification rate.

The deflection amount determining section 180 is connected to the storage section 150, reads the configuration information of the sample 10 and the configuration information of the line pattern, calculates the adjustment amount by which the irradiation position of the array beam is to be adjusted according to the information concerning the position error of the sample 10 and the irradiation position error of the array beam, and determines a deflection amount corresponding to this adjustment amount. The deflection amount determining section 180 is connected to the column section 120 and adjusts the irradiation position of the array beam based on the determined deflection amount. The deflection amount determining section 180 supplies the adjusting section 80 with a control signal for deflecting the array beam according to the determined deflection amount, via the deflecting section drive circuit 182. Here, the deflecting section drive circuit 182 converts the control signal corresponding to the deflection amount output from the deflection amount determining section 180 into a drive signal that is input to the adjusting section 80.

The scanning control section 190 is connected to the stage section 110 and scans the irradiation positions of the plurality of charged particle beams along the longitudinal direction of the line pattern. The scanning control section 190 according to the present embodiment performs scanning with the array beam along the longitudinal direction of the line pattern by moving the stage apparatus 112 with the sample 10 mounted thereon in a direction substantially parallel to the X direction. The scanning control section 190 supplies a control signal for moving the stage apparatus 112, via the stage drive circuit 192. The stage drive circuit 192 converts the control signal corresponding to the movement amount and the movement direction output from the scanning control section 190 into a corresponding drive signal for the stage apparatus 112.

The scanning control section 190 is connected to the stage position detecting section 114 and receives a detection result of the stage position of the stage apparatus 112. The scanning control section 190 may acquire the movement amount by which the stage apparatus 112 actually moved and the position error of the stage, i.e. the movement error, based on the detection result, and provide feedback for the movement control of the stage apparatus 112. Furthermore, the scanning control section 190 may be connected to the deflection amount determining section 180 and adjust the paths traveled by the charged particle beams according to the movement error of the sample 10 caused by the stage section 110.

The scanning control section 190 is connected to the selecting section 160 and the irradiation control section 170, and supplies the selecting section 160 and the irradiation control section 170 with the position information of the stage apparatus 112. The irradiation control section 170 acquires the timing at which the line pattern of the sample 10 is irradiated by the array beam, based on the position information of the stage apparatus 112.

The scanning control section 190 moves the irradiation position of the array beam in the width direction of the line pattern as well, and performs scanning such that a predetermined region on the surface of the sample 10 becomes the possible irradiation region of the array beam. The following describes an example of the scanning control section 190 performing scanning with the array beam, using FIG. 2.

Figure 2:
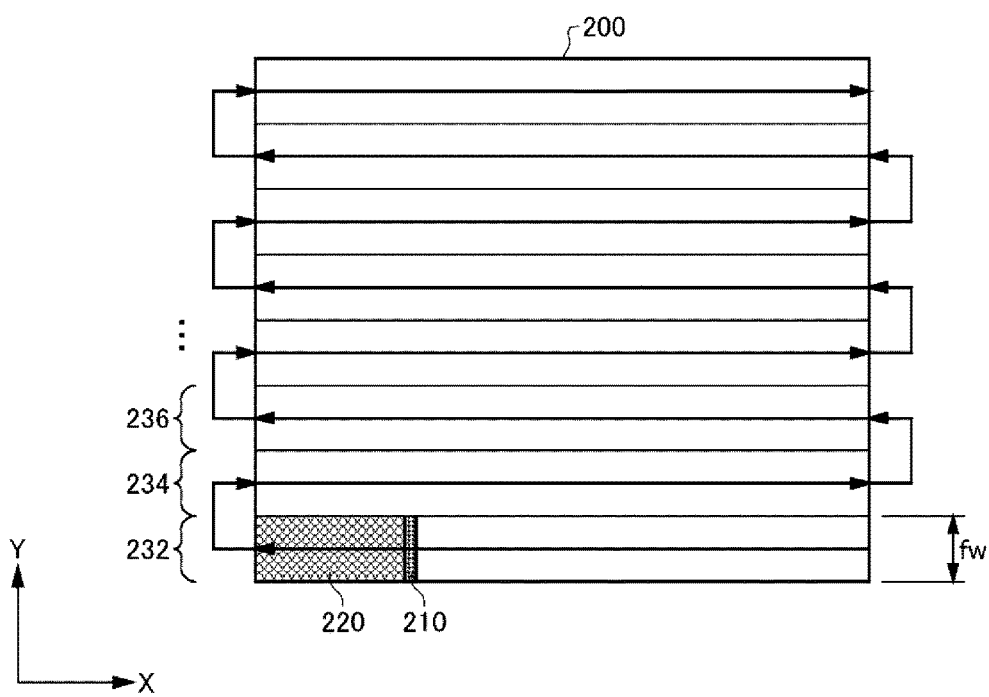
FIG. 2 shows an example of a possible irradiation region 200 formed in a portion of the surface of the sample 10 by the exposure apparatus 100 according to the present embodiment scanning with the array beam.

An example of a possible irradiation region 200 formed in a portion of the surface of the sample 10 by the exposure apparatus 100 according to the present embodiment scanning with the array beam is shown. FIG. 2 shows the surface of the sample 10 substantially parallel to the XY plane, and fw indicates the beam width of the total of all the electron beams lined up in the Y direction of the array beam radiated by the exposure apparatus 100, i.e. the width direction of the line pattern. Here, the beam width fw is substantially 30 µm, for example.

The scanning control section 190 moves the sample 10 in the longitudinal direction of the line pattern using the stage section 110, in a state where the paths travelled by the charged particle beams are maintained. FIG. 2 shows an example in which the scanning control section 190 moves the stage apparatus 112 in the −X direction. In this way, the surface of the sample 10 is scanned by the irradiation position 210 of the array beam scan in the +X direction, and the array beam sets a band-shaped region 220 as the possible irradiation region of the electron beams. Specifically, the scanning control section 190 moves the stage apparatus 112 a predetermined distance in the X direction to set a first frame 232 as the possible irradiation region. Here, the first frame 232 has a surface area of 30 µm by 30 µm.

Next, the scanning control section 190 moves the stage apparatus 112 in the −Y direction by the beam width fw of the array beam, and then moves the stage apparatus 112 back in the +X direction by an amount equal to the predetermined distance that the stage apparatus 112 was previously moved in the −X direction. As a result, a portion of the surface of the sample 10 differing from the first frame 232 is scanned by the irradiation position 210 of the array beam in the −X direction, and a second frame 234 adjacent to the first frame 232 in the +Y direction and having substantially the same surface area as the first frame 232 is set as the possible irradiation region. In the same manner, the scanning control section 190 moves the stage apparatus 112 in the Y direction by the beam width fw of the array beam, and then moves the stage apparatus 112 in the −X direction by the predetermined distance and sets a third frame 236 as the possible irradiation region.

In this way, the scanning control section 190 moves the stage apparatus 112 back and forth in the X direction, which is the longitudinal direction of the line pattern, and sets a predetermined region on the surface of the sample 10 to be the possible irradiation region 200 of the array beam. Here, the scanning control section 190 sets a 30×30 mm square region to be the possible irradiation region 200.

The present embodiment describes an example in which the scanning control section 190 sets a square region to be the possible irradiation region 200 of the array beam by moving the stage apparatus 112 back and forth, but the present invention is not limited to this, and the scanning control section 190 may perform scanning by deflecting the radiation direction of the array beam. In this case, the scanning control section 190 may supply a deflection amount corresponding to the distance to be scanned to the deflection amount determining section 180 and perform scanning with the array beam. Furthermore, the present embodiment describes an example in which the scanning control section 190 sets the possible irradiation region 200 of the array beam to have a rectangular shape, but the present invention is not limited to this, and a predetermined region formed by the scanning with the array beam may be set as the possible irradiation region 200 of the array beam.

The exposure apparatus 100 according to the present embodiment described above exposes the sample 10 by radiating the array beam corresponding to the irradiation position on the line pattern while moving the stage apparatus 112 back and forth in the X direction, which is the longitudinal direction of the line pattern. In other words, the exposure apparatus 100 irradiates the line pattern within the possible irradiation region 200 of the array beam with charged particle beams at an exposure position corresponding to the cut pattern and the via pattern to be formed. The exposure operation of the exposure apparatus 100 is described below using FIG. 3.

Figure 3:
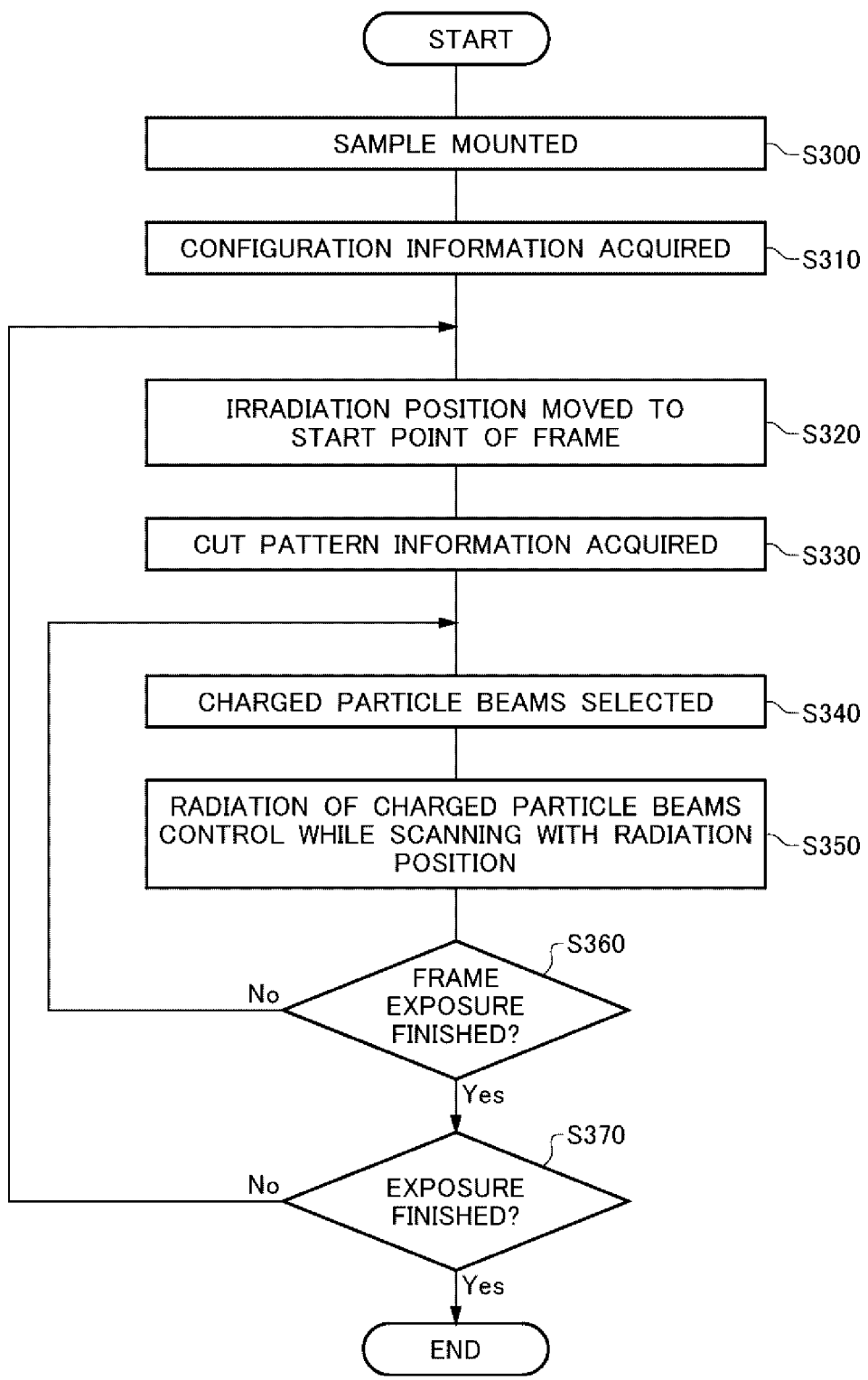
FIG. 3 shows an operational flow of the exposure apparatus 100 according to the present embodiment.

FIG. 3 shows an operational flow of the exposure apparatus 100 according to the present embodiment. The present embodiment describes an example in which the exposure apparatus 100 exposes a cut pattern on the line pattern on the surface of the sample 10, by performing the processes from S300 to S370.

First, the sample 10 that has the line pattern formed thereon and a resist applied thereto is mounted on the stage section 110 (S300). Next, the exposure apparatus 100 acquires the configuration information of the mounted sample 10 and the configuration information of the line pattern (S310). The exposure apparatus 100 stores the acquired configuration information in the storage section 150.

The exposure apparatus 100 acquires the configuration information of the sample 10 and/or the configuration information of the line pattern by observing a plurality of positioning markers or the like provided on the sample 10, for example. In this case, the exposure apparatus 100 may acquire the configuration information of the line pattern by irradiating the positioning markers with the electron beams and detecting the irradiation position of the electron beams and the positions of the positioning markers from a surface image of the sample 10 obtained by detecting secondary electrons or reflected electrons, for example.

The exposure apparatus 100 may acquire the configuration information of the sample 10 by irradiating the positioning markers with laser light, for example, and detecting the reflected light or scattered light. When the exposure apparatus 100 acquires the configuration information of the sample 10 and the configuration information of the line pattern through measurement in this way, the exposure apparatus 100 may further include a detecting section for detecting secondary electrons or reflected electrons, a laser light radiating apparatus, and a light detecting section, for example.

Next, the scanning control section 190 moves the stage apparatus 112 to a position corresponding to a start point of a frame to be exposed, such that the irradiation position of the array beam is positioned at this start point (S320). When the scanning control section 190 moves the stage apparatus 112 in the +X direction, i.e. moves the irradiation position of the array beam in the −X direction, and exposes the frame, the edge of this frame in the +X direction is set as the start point of the frame.

When the scanning control section 190 moves the stage apparatus 112 in the −X direction, i.e. moves the irradiation position of the array beam in the +X direction, and exposes the frame, the edge of this frame in the −X direction is set as the start point of the frame. When the scanning control section 190 moves the stage apparatus 112 back and forth for each frame in the X direction, which is the longitudinal direction of the line pattern, the scanning control section 190 switches between using the edge in the −X direction and using the edge in the +X direction as the start point of the frame in an alternating manner.

At the beginning stage of the exposure operation, the scanning control section 190 may set the start point of the frame to be a predetermined position. For example, the scanning control section 190 sets the edge in the −X direction of the frame positioned farthest on the −Y direction side to be the start point of the frame.

Figure 4:
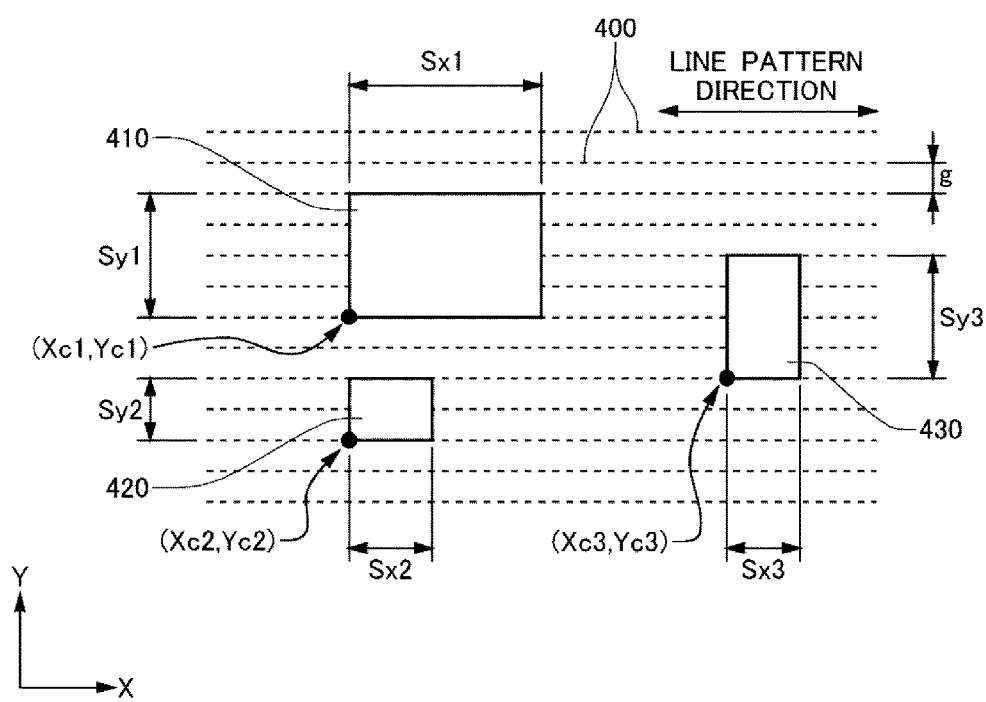
FIG. 4 shows an example of the information of the cut pattern to be formed on the sample 10.

Next, the selecting section 160 acquires from the storage section 150 the information of the cut pattern within the frame to be exposed (S330). FIG. 4 shows an example of the information of the cut pattern to be formed on the sample 10. The information of the cut pattern may include data concerning the position and the size of the cut pattern displayed as a rectangle. FIG. 4 shows an example in which the cut pattern data is the length of two sides of the cut pattern and the coordinates of predetermined portions (each vertex on the −X direction side and −Y direction side, which are the vertices in the lower left portions in the drawing).

More specifically, the {(position), size} of the cut pattern data of a first pattern 410 is shown as {(Xc1, Yc1), Sx1, Sy1}. Similarly, the {(position), size} of the cut pattern data of a second pattern 420 is shown as {(Xc2, Yc2), Sx2, Sy2} and the {(position), size} of the cut pattern data of a third pattern 430 is shown as {(Xc3, Yc3), Sx3, Sy3}.

The X direction in FIG. 4 substantially matches the longitudinal direction of the line pattern, which is the target on which the cut pattern is being imposed. In FIG. 4, the dotted lines parallel to the X direction and arranged at intervals of g in the Y direction are a grid 400 used for designing the line pattern and the cut pattern. For example, the interval g is the grid width, and this grid width g is substantially equal to the minimum value of the line width in the short direction of the line pattern, i.e. the Y direction. Furthermore, when the line pattern has a plurality of different line widths, the line widths are all values that are n times the grid width g, where n is a natural number greater than or equal to 1. Furthermore, the pattern interval in the Y direction between adjacent line patterns is a value that is m times the grid width g, where m is a natural number greater than or equal to 1.

In the same manner, the length of the cut pattern in the Y direction and the pattern interval in the Y direction are each values that are natural number (greater than or equal to 1) multiples of the grid width g. For example, the length of the first pattern 410 in the Y direction is substantially equal to 4g, the length of the second pattern 420 in the Y direction is substantially equal to 2g, and the pattern interval in the Y direction between the first pattern 410 and the second pattern 420 is substantially equal to 2g. Furthermore, in the example of FIG. 4, the Y coordinates of the cut pattern are designed to be substantially equal on the grid 400. In this way, the cut pattern and the line pattern according to the present embodiment have Y coordinates that are designed using the coordinate values of the grid 400 as a reference.

Figure 5:
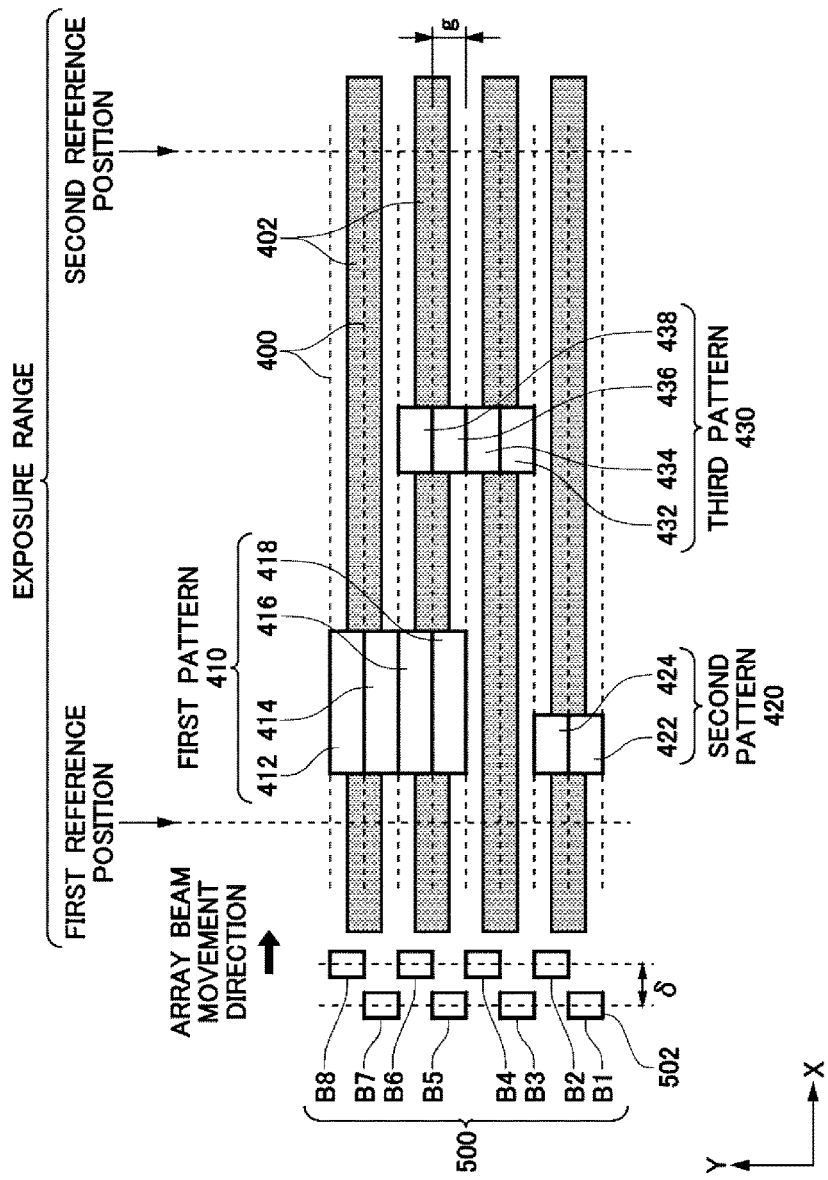
FIG. 5 shows an example in which the scanning control section 190 according to the present embodiment moves the irradiation position of the array beam to the start point of a frame.

FIG. 5 shows an example in which the scanning control section 190 according to the present embodiment moves the irradiation position of the array beam to the start point of a frame, i.e. the edge of the frame on the −X side. Specifically, FIG. 5 is a view of the XY plane showing an example of the positional relationship between the line pattern 402 formed on the surface of the sample and the irradiation position of the array beam 500. Furthermore, FIG. 5 is a view of the XY plane showing examples of the positional relationship between the line pattern 402 and the cut pattern shown in FIG. 4.

The example of FIG. 5 shows a case in which one frame includes four line patterns 402, and the line width of each line pattern 402 and the intervals between adjacent line patterns 402 are both substantially equal to the grid width g of the grid 400. In the drawing, the first pattern 410 is a pattern in which two line patterns 402 from the uppermost portion are cut simultaneously, the second pattern 420 is a pattern in which a line pattern 402 of the bottommost portion is cut, and the third pattern 430 is a pattern in which two line patterns 402 in the center are cut simultaneously.

FIG. 5 shows an example in which the array beam 500 includes a total of eight electron beams B1 to B8. The array beam 500 irradiates each of a plurality of irradiation regions 502 on the sample 10 with an electron beam. The beam width in the width direction of the line patterns, i.e. the Y direction, of each of the electron beams B1 to B8 is substantially equivalent to the grid width g. Furthermore, the irradiation positions of the electron beams B1 to B8 on the sample 10 are arranged at intervals of the grid width g, resulting in a total width of substantially 8g, such that a range with a width of substantially 8g in the frame is exposed. In other words, the array beam 500 has a beam width in the Y direction that is a value equal to the product of the number of electron beams in the array beam 500 and the grid width g, and a frame having a width in the Y direction substantially equal to this beam width is exposed.

Here, when the irradiation positions of the plurality of electron beams can be arranged in one column with intervals of the grid width g therebetween, the column section 120 may irradiate the sample 10 with the array beams 500 lined up in this column. Instead, the column section 120 may irradiate the sample 10 with array beams 500 for which the irradiation positions of the electron beams are arranged in a plurality of columns.

FIG. 5 shows an example in which the array beam 500 includes electron beams that are lined up in two columns with a distance δ therebetween in the longitudinal direction of the line pattern. The irradiation positions of the electron beams included in each column are arranged with intervals substantially equal to the grid width g therebetween in the width direction of the line pattern. Accordingly, the column including the odd-numbered electron beams B1, B3, B5, and B7, which is referred to as the "first column," has a total width in the Y direction of substantially 7g. Similarly, the column including the even-numbered electron beams, which is referred to as the "second column," has a total width in the Y direction of substantially 7g.

At step S320 when the scanning control section 190 moves the irradiation position of the array beam 500 to the start point of the frame, the irradiation positions of the electron beams are arranged respectively between the corresponding grid lines. FIG. 5 shows an example in which the irradiation position of the electron beam B1 arranged first from the −Y direction side is positioned between the first and the second grid lines from the −Y direction side, and the irradiation position of the electron beam Bn arranged n-th from the −Y direction side is positioned between the n-th grid line and the (n+1)-th grid line from the −Y direction side.

In the manner described above, in order to expose the cut pattern designed using the grid 400 coordinate values as a reference, the scanning control section 190 moves the irradiation position of the array beam 500 to positions based on this grid 400. Therefore, the scanning control section 190 can expose a frame having a width of n×g between the corresponding first to (n+1)-th grid lines, by scanning with the irradiation position of the array beam 500s including n electron beams along the longitudinal direction of the line pattern.

Next, the selecting section 160 selects the charged particle beams to be used for the exposure (S340). The selecting section 160 may determine the cut pattern for the exposure based on the information of the irradiation position of the array beam received from the scanning control section 190. The Y coordinates of the cut pattern are designed to be substantially equal to the grid 400, and therefore the selecting section 160 can perform exposure with the first pattern 410 having a width of 4g by radiating the four electron beams B5 to B8 while scanning with the irradiation position of the array beam 500 along the longitudinal direction of the line pattern, for example.

In other words, in order to perform exposure of the first pattern 410, the selecting section 160 selects the four electron beams B5 to B8 as the electron beams to be used for the exposure. Then, the electron beam B5 is used for exposure of a partial pattern 418 of the first pattern 410, the electron beam B6 is used for exposure of a partial pattern 416 of the first pattern 410, the electron beam B7 is used for exposure of a partial pattern 414 of the first pattern 410, and the electron beam B8 is used for exposure of a partial pattern 412 of the first pattern 410.

Here, the selecting section 160 can select the electron beams to be used for the exposure according to the values of the Y coordinates of the cut pattern. For example, in response to the Y coordinate values of the second pattern 420 being positioned between the first and third grid lines from the −Y direction side, the selecting section 160 selects the electron beams B1 and B2 having irradiation positions in this region. Furthermore, in response to the Y coordinate values of the third pattern 430 being positioned between the third and seventh grid lines from the −Y direction side, the selecting section 160 selects the electron beams B3 to B6 having irradiation positions in this region.

In this way, the electron beam B1 is used for exposure of a partial pattern 422 of the second pattern 420, and the electron beam B2 is used for exposure of a partial pattern 424 of the second pattern 420. Furthermore, the electron beam B3 is used for exposure of a partial pattern 432 of the third pattern 430, the electron beam B4 is used for exposure of a partial pattern 434 of the third pattern 430, the electron beam B5 is used for exposure of a partial pattern 436 of the third pattern 430, and the electron beam B6 is used for exposure of a partial pattern 438 of the third pattern 430.

The selecting section 160 detects the irradiation positions that are to be irradiated by the selected electron beams. The selecting section 160 detects the irradiation positions to be irradiated according to the cut pattern as designated irradiation positions. The selecting section 160 detects the designated irradiation positions according to the time that has passed from when the irradiation positions of a plurality of charged particle beams have passed by predetermined reference positions in the longitudinal direction of the line pattern.

FIG. 5 shows an example of two reference positions determined in advance in the longitudinal direction of the line pattern, which are a first reference position and a second reference position. Specifically, the region between the first reference position and the second reference position is set as the exposure range, and the selecting section 160 detects the designated irradiation position of each of the plurality of electron beams according to the time that has passed from when the irradiation position of the corresponding array beam 500 has passed the first reference position.

In addition to this, three or more reference positions may be set in advance in the longitudinal direction of the line pattern. Specifically, a single frame is divided into a plurality of exposure regions, and the selecting section 160 may detect the designated irradiation position of each of the plurality of electron beams in each exposure range. In this case, the selecting section 160 detects each designated irradiation position according to the reference position that was most recently passed from among the plurality of reference positions in the longitudinal direction of the line pattern 402 by the irradiation position of the charged particle beam and the time that has passed from when this reference position was passed. The selection of the electron beams by the selecting section 160 and the detection of the irradiation positions is described below using FIGS. 6 and 7.

Figure 6:
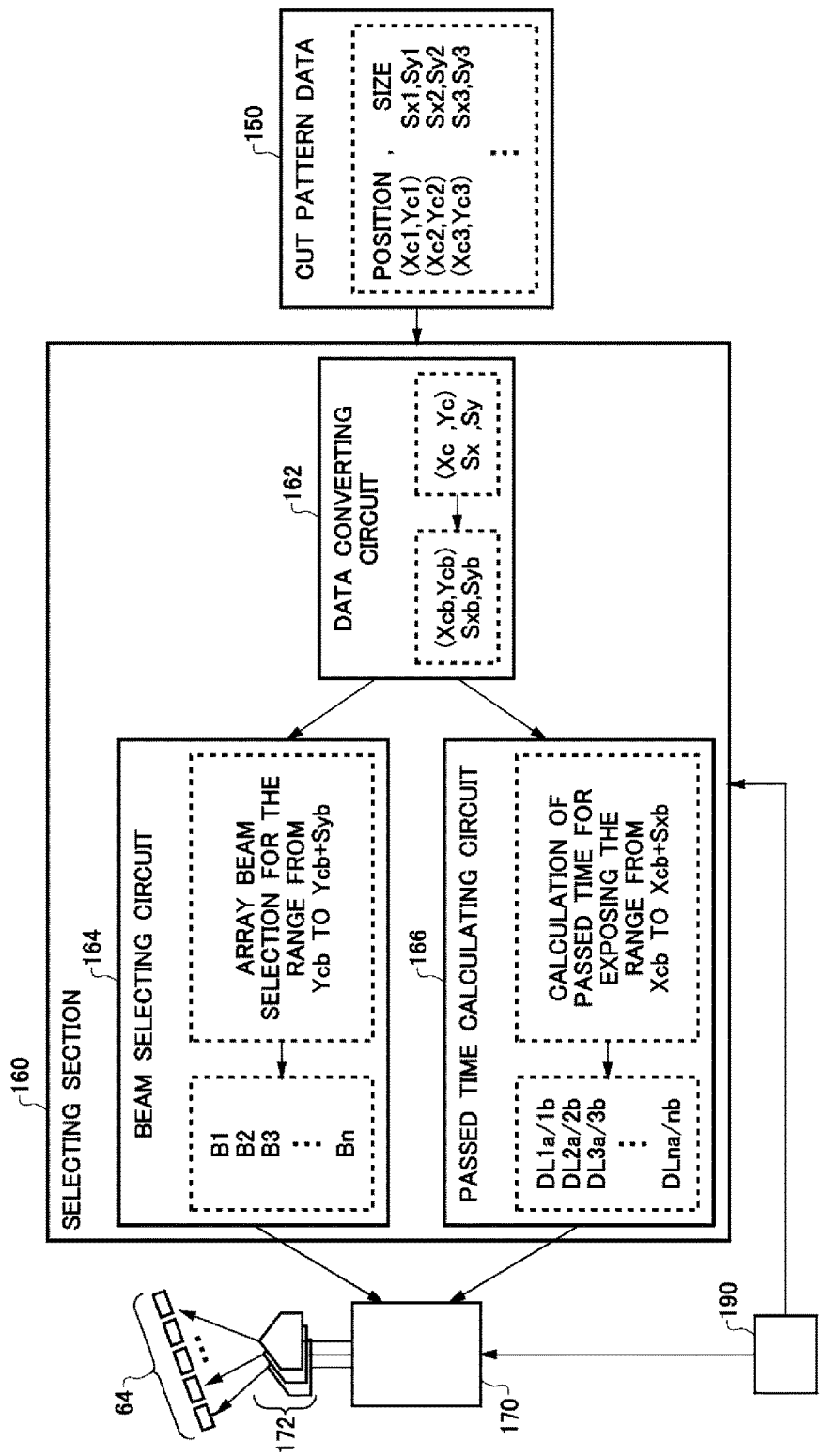
FIG. 6 shows an example of the selecting section 160 according to the present embodiment.

FIG. 6 shows an example of the selecting section 160 according to the present embodiment. The selecting section 160 includes a data converting circuit 162, a beam selecting circuit 164, and a passed time calculating circuit 166.

The data converting circuit 162 selects the cut pattern data from the storage section 150 and converts this cut pattern data into a coordinate system relating to the configuration of the line pattern on the sample 10. The data converting circuit 162 acquires (Xci, Yci), Sxi, Syi (i=1, 2, 3, etc.) as the cut pattern data from the storage section 150, for example, and converts this data into (Xcbi, Ycbi), Sxbi, Sybi (i=1, 2, 3, etc.) that is exposure data in a coordinate system on the sample 10. Here, the Y coordinate values Yci and Syi of the cut pattern data are values that are integer multiples of the grid width g, and therefore the values Ycbi and Sybi resulting from the conversion are also discrete values.

The data conversion performed by the data converting circuit 162 is intended to correct the rotational error caused when the sample 10 is loaded onto the stage apparatus 112 and the deformation error of the sample 10 caused by the device manufacturing processes such as etching and film formation of the sample 10, for example. In other words, if the precision of the stage apparatus 112, the precision of the manufacturing process, and the like are sufficiently high, this correction is a data conversion for correcting the distance error to be approximately 10 ppm or less and the angle error to be approximately 1 mrad or less.

For example, in a case where the pattern width Sxi, Syi is from tens to hundreds of nanometers, even if this data conversion is performed, the resulting change will be less than 0.1 nm. In other words, in this case, when the processing is performed to cut away 0.1 nm or less, the expressions Sxi=Sxbi and Syi=Sybi are established. Accordingly, when the rotational error and the deformation error occurring for the sample 10 are within a predetermined range, the selecting section 160 may omit the data conversion relating to Sxi and Syi performed by the data converting circuit 162.

The beam selecting circuit 164 selects the electron beams to be used based on the exposure data (Xcb, Ycb), Sxb, Syb. For example, in a case where the Y direction coordinates of the grid 400 shown in FIG. 5 are Yc1, Yc2, . . . , Yc8 from the −Y direction side, the beam selecting circuit 164 selects the electron beam B1 as the electron beam to be used for the exposure in the Y coordinate range from Yc1 to Yc2. Specifically, for the cut pattern positioned from the coordinate Ycb to the coordinate Ycb+Syb, the beam selecting circuit 164 selects the electron beams B1, B2, . . . , Bn to be used for the exposure to be the electron beams corresponding to these coordinates.

For each of the electron beams B1 to Bn selected by the beam selecting circuit 164, the passed time calculating circuit 166 detects the timing for switching the electron beam to the ON state or the OFF state. The passed time calculating circuit 166 detects this timing based on the X coordinate of the exposure data, and outputs the result as the passed time, for example. Here, the passed time is the time until each electron beam included in the array beam 500 is set to the ON state or the OFF state, with the time at which the array beam passed the reference position as the origin.

The scanning control section 190 scans with the array beam 500 in the +X direction or the −X direction, which are the longitudinal direction of the line pattern. In a case where the cut pattern data is expressed by the exposure data (Xcb, Ycb), Sxb, Syb and the scanning control section 190 scans with the array beam 500 in the +X direction, by causing an electron beam to be in the ON state at the time when the irradiation position of the electron beam corresponding to the X-axis coordinate reaches the position Xcb and causing the electron beam to be in the OFF state when the irradiation position reaches the position Xcb+Sxb, it is possible to perform exposure within the pattern region of the cut pattern with this electron beam. In other words, the passed time calculating circuit 166 detects the passed time to be the time from a timing when the array beam 500 has passed the first reference position on the −X side of the exposure range to a timing when the electron beam has been switched to the ON state and the OFF state.

On the other hand, when the scanning control section 190 scans with the array beam 500 in the −X direction, by causing an electron beam to be in the ON state at the time when the irradiation position of the electron beam corresponding to the X-axis coordinate reaches the position Xcb+Sxb and causing the electron beam to be in the OFF state when the irradiation position reaches the position Xcb, it is possible to perform exposure within the pattern region of the cut pattern with this electron beam. In this case, the passed time calculating circuit 166 detects the passed time to be the time from a timing when the array beam 500 has passed the second reference position on the +X side of the exposure range to the timing when the electron beam has been switched to the ON state and the OFF state.

When a plurality of reference positions are set within a frame, the passed time calculating circuit 166 may detect the passed time to be from the timing when the reference position most recently passed among the plurality of reference positions was passed to the timing when the electron beam is switched to the ON state and the OFF state. For example, the passed time calculating circuit 166 calculates the passed time according to the velocity at which the scanning control section 190 scans with the array beam 500 in the longitudinal direction of the line pattern. In this case, the scanning control section 190 preferably performs exposure while continuously moving the array beam 500 in the frame, and when performing scanning in the longitudinal direction of the line pattern, may control the velocity V of the array beam 500 such that the velocity V changes smoothly and at least does not become zero.

When the scanning control section 190 scans with the array beam 500 in the +X direction, the first reference position has an X coordinate S, the pattern start position of the cut pattern for the exposure is Xcd, and the pattern width, i.e. the pattern width in the X-axis direction, is Sxb, the passed time calculating circuit 166 can calculate the passed time (DLa) until the electron beam is set to the ON state using the expression shown below. The passed time calculating circuit 166 may receive information concerning the velocity V from the scanning control section 190.

$$DLa=(Xcb-S)/V \qquad \text{Expression 1}$$

The passed time calculating circuit 166 can calculate the passed time (DLb) until the electron beam is set to the OFF state at the pattern end position Xcb+Sxb using the expression shown below.

$$DLb=(Xcb+Sxb-S)/V \qquad \text{Expression 2}$$

For the electron beams B1, B2, . . . , Bn selected by the beam selecting circuit 164, the passed time calculating circuit 166 respectively calculates the passed times until the electron beams re set to the ON state to be DL1$a$, DL2$a$, . . . , DLn$a$. Furthermore, the passed time calculating circuit 166 respectively calculates the passed times until the electron beams are set to the OFF state to be DL1$b$, DL2$b$, . . . , DLn$b$.

In this way, the beam selecting circuit 164 and the passed time calculating circuit 166 respectively perform the selection of the electron beams to be used for the exposure and the detection of the passed time, corresponding to the cut pattern for the exposure. The selecting section 160 supplies the irradiation control section 170 with the selection result of the beam selecting circuit 164 and the detection result of the passed time calculating circuit 166.

Next, the exposure control section 140 controls the radiation of the charged particle beams while scanning with the irradiation position of the array beam 500 (S350). Specifically, the scanning control section 190 scans with the irradiation position of the array beam 500 with a velocity V by moving the stage apparatus 112, and supplies the irradiation control section 170 with the irradiation position of the array beam 500 based on the position detection result of the stage position detecting section 114. The irradiation control section 170 supplies a control signal to the corresponding blanking electrode 64 of the blanking section 60 in order to control the radiation of a selected electron beam, according to the irradiation position of the array beam 500 and the passed time.

Figure 7:
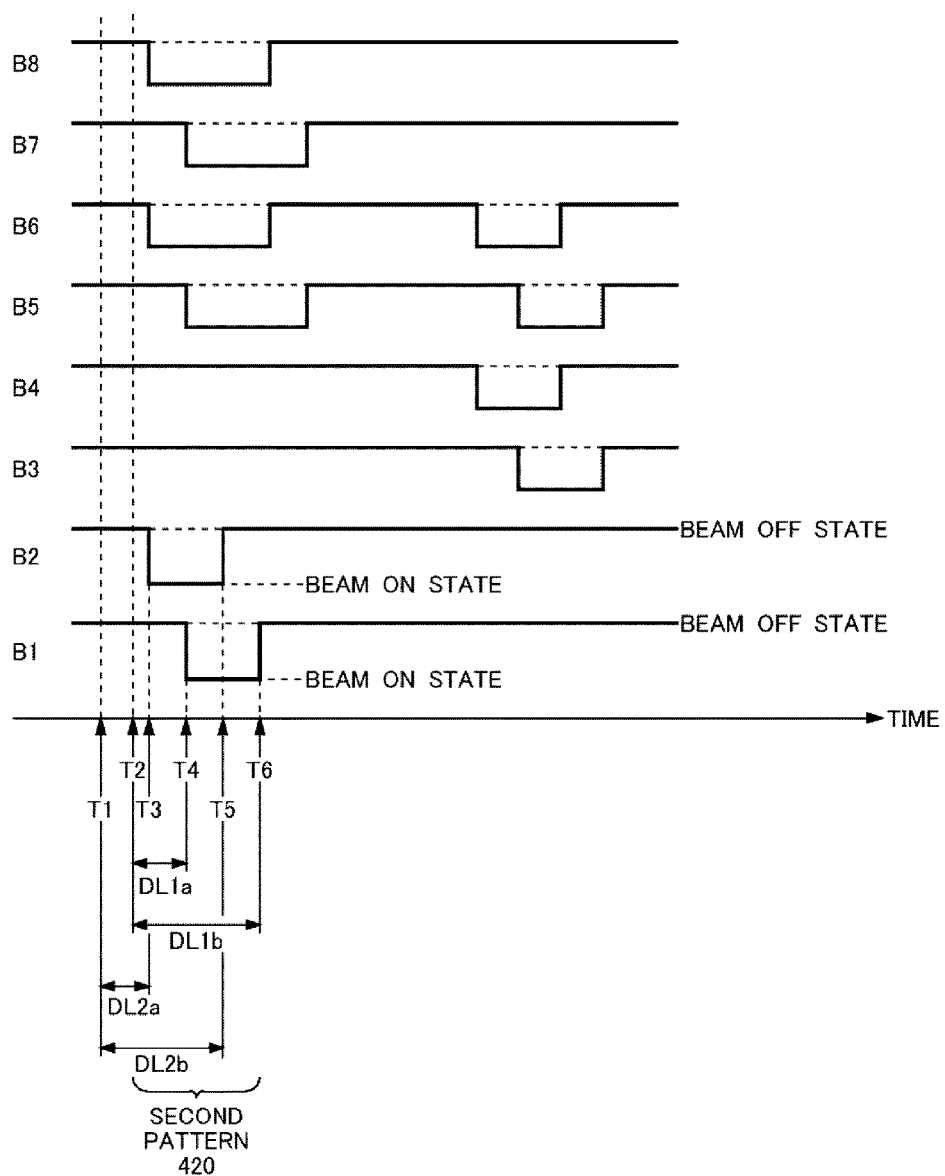
FIG. 7 is an exemplary timing chart for the control signals supplied blanking electrodes 64 by the irradiation control section 170 according to the present embodiment.

FIG. 7 is an exemplary timing chart for the control signals supplied to the blanking electrodes 64 by the irradiation control section 170 according to the present embodiment. Specifically, FIG. 7 shows the timing of the blanking operation for the electron beams B1 to B8 for exposure of the cut pattern in the exposure range shown in FIG. 5. In FIG. 7, the horizontal axis indicates time and the vertical axis indicates voltage.

The eight control signals shown in FIG. 7 are examples of the control signals supplied to the blanking electrodes 64 corresponding to the electron beams B1 to B8. Specifically, when the voltage level of a control signal is in a high state, the irradiation control section 170 supplies a signal voltage corresponding to this control signal to the blanking electrode 64, thereby causing the corresponding electron beam to be deflected and setting this electron beam to the OFF state. Furthermore, when the voltage level of a control signal is in a low state, the irradiation control section 170 does not supply a signal voltage to the blanking electrode 64, thereby causing the corresponding electron beam to be passed and setting this electron beam to the ON state.

On the time axis, the timing shown by T1 is the timing at which the second column including the electron beams B2, B4, B6, and B8 passes the first reference position. Furthermore, the timing shown by T2 is the timing at which the first column including the electron beams B1, B3, B5, and B7 passes the first reference position. Here, T2−T1=δ/V.

The signals shown by B1 and B2 in FIG. 7 are the control signals for exposure of the second pattern 420 of the cut pattern shown in FIG. 5 using the electron beams B1 and B2. The selecting section 160 selects the electron beams B1 and B2 based on the cut pattern data of the second pattern 420, and detects the passed time. FIG. 7 shows an example in which the irradiation control section 170 generates the control signals B1 and B2 according to the passed time.

The irradiation control section 170 switches the electron beam B1 from the OFF state to the ON state at the timing T4, which occurs when the passed time DL1$a$ has passed from the timing T2 at which the irradiation position of the electron beam B1 passed the first reference position. The irradiation control section 170 switches the electron beam B1 from the ON state to the OFF state at the timing T6, which occurs when the passed time DL1$b$ has passed from the timing T2.

The irradiation control section 170 switches the electron beam B2 from the OFF state to the ON state at the timing T3, which occurs when the passed time DL2$a$ has passed from the timing T1 at which the irradiation position of the electron beam B2 passed the first reference position. The irradiation control section 170 switches the electron beam B2 from the ON state to the OFF state at the timing T5, which occurs when the passed time DL2$b$ has passed from the timing T1.

In this way, the irradiation control section 170 can generate the control signals for controlling radiation of the electron beams according to the passed time and the selection result of the selecting section 160 and the position information of the irradiation position of the scanning performed by the scanning control section 190. By supplying the blanking electrodes 64 with the control signals generated by the irradiation control section 170, the column section 120 can expose the second pattern 420 of the cut pattern on the sample 10.

Similarly, the irradiation control section 170 generates the control signals of the electron beams B3 to B8 selected by the selecting section 160 to expose the first pattern 410 and the third pattern 430 on the sample 10. In the manner described above, the irradiation control section 170 according to the present embodiment controls the operation of switching the electron beams to the ON state and the OFF state based on the time that has passed from the timing at which the irradiation position passes a reference position. Therefore, the length of the exposure range from the first reference position to the second reference position is defined according to the number of bits of a clock that counts the passed time.

The smallest period of this clock may be set according to a predetermined position resolution and stage velocity. For example, in a case where the data step of the exposure position is 0.125 nm, when the position resolution is set to a value of 0.0625 nm that is half of the data step and the maximum movement velocity of the stage is set to 50 mm/sec, the clock period is determined to have a minimum of 1.25 ns. Here, when the number of count bits of the clock counter is 12 bits (=4096), the count can be performed up to a passed time of approximately 5 µs. During this passed time, the stage moves 0.25 µm with the maximum movement velocity of 50 mm/sec.

In this way, the exposure apparatus 100 of the present embodiment can design the exposure range length in advance based on the clock frequency. By providing a plurality of reference positions and controlling the radiation of the electron beams based on the passed time from each reference position, the exposure apparatus 100 can expose a frame having an exposure range that is longer than the above exposure range.

Specifically, for all of the exposure ranges included in one frame, the exposure control section 140 scans with the irradiation position of the array beam 500 and controls the radiation of the electron beams based on the passed time from the reference position for each reference position that is passed. In other words, the exposure control section 140 performs exposure by controlling the plurality of electron beams while scanning with the irradiation position of the array beam 500 in the exposure range from the first reference position to the subsequent second reference position shown in the example of FIG. 5.

In a case where a further reference position is included in the frame, the exposure control section 140 continues exposing this frame (S360: No) and returns to step S340 for selecting the charged particle beams, in order to expose the next exposure range from the second reference position to the third reference position. The exposure control section 140 repeats the operations from S340 to S350 for this frame, until there are no more reference positions passed by the irradiation position of the array beam 500. While the scanning control section 190 is scanning the exposure range from the reference position most recently passed by the irradiation position of the array beam 500 to the subsequent reference position, the selecting section 160 may perform the detection of the passed time and the selection of the electron beams corresponding to a following exposure range that follows after the subsequent reference position. In this way, the exposure control section 140 can perform exposure of adjacent exposure ranges continuously over time.

In a case where there are no further reference positions in the frame (S360: Yes), the exposure control section 140 ends the exposure of this frame. In a case where there is a subsequent frame to be exposed (S370: No), the process returns to S320 and irradiation position of the array beam 500 is moved to the start point of the subsequent frame and exposure of this subsequent frame is performed. The exposure control section 140 repeats the operations from S320 to S360 until there are no more frames to be exposed. In a case where there are no more frames to be exposed (S370: Yes), the exposure control section 140 ends the exposure of this frame.

In the manner described above, the exposure apparatus 100 according to the present embodiment divides the possible irradiation region 200 of the array beam into frames and, for each frame, repeats the exposure operation of controlling the plurality of electron beams while scanning with the irradiation position of the array beam 500 in the longitudinal direction of the line pattern, thereby exposing the possible irradiation region 200. By moving the sample 10 with the stage apparatus 112, the exposure apparatus 100 can form a plurality of different possible irradiation regions 200 on the surface of the sample 10, and can therefore perform exposure of the entire line pattern formed on the surface of the sample 10 with a single column section 120.

Figure 8:
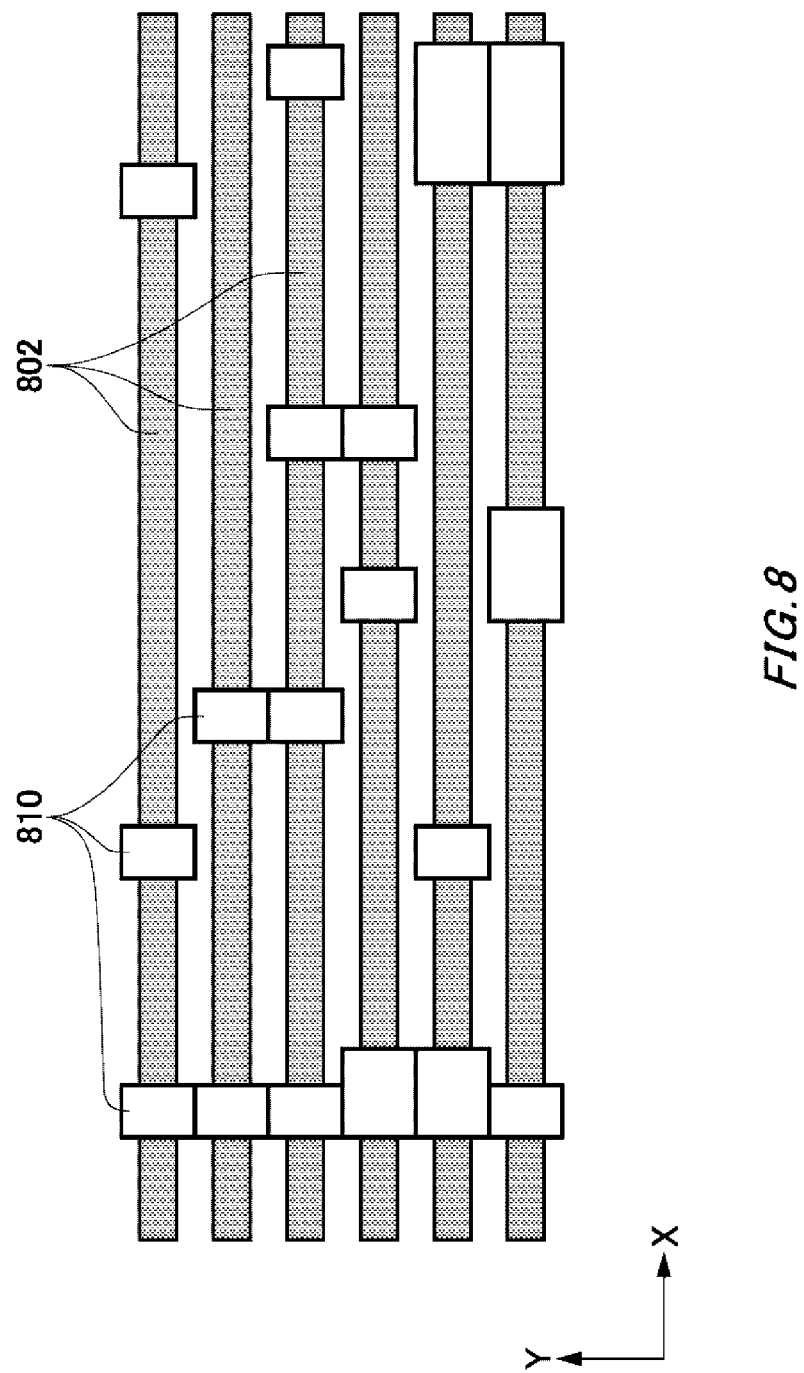
FIG. 8 shows an exemplary line pattern 802 formed on the surface of the sample 10.

FIG. 8 shows an exemplary line pattern 802 formed on the surface of the sample 10. The exposure apparatus 100 according to the present embodiment exposes the region displayed by the cut pattern 810 in the resist formed on the line pattern 802, by performing the operation described in FIG. 3. Through this exposure, the resist in the region of the cut pattern 810 can be removed, and therefore the line pattern 802 positioned at this cut pattern is exposed and the exposed line pattern 802 can be etched to form a fine wire pattern or the like.

Figure 9:
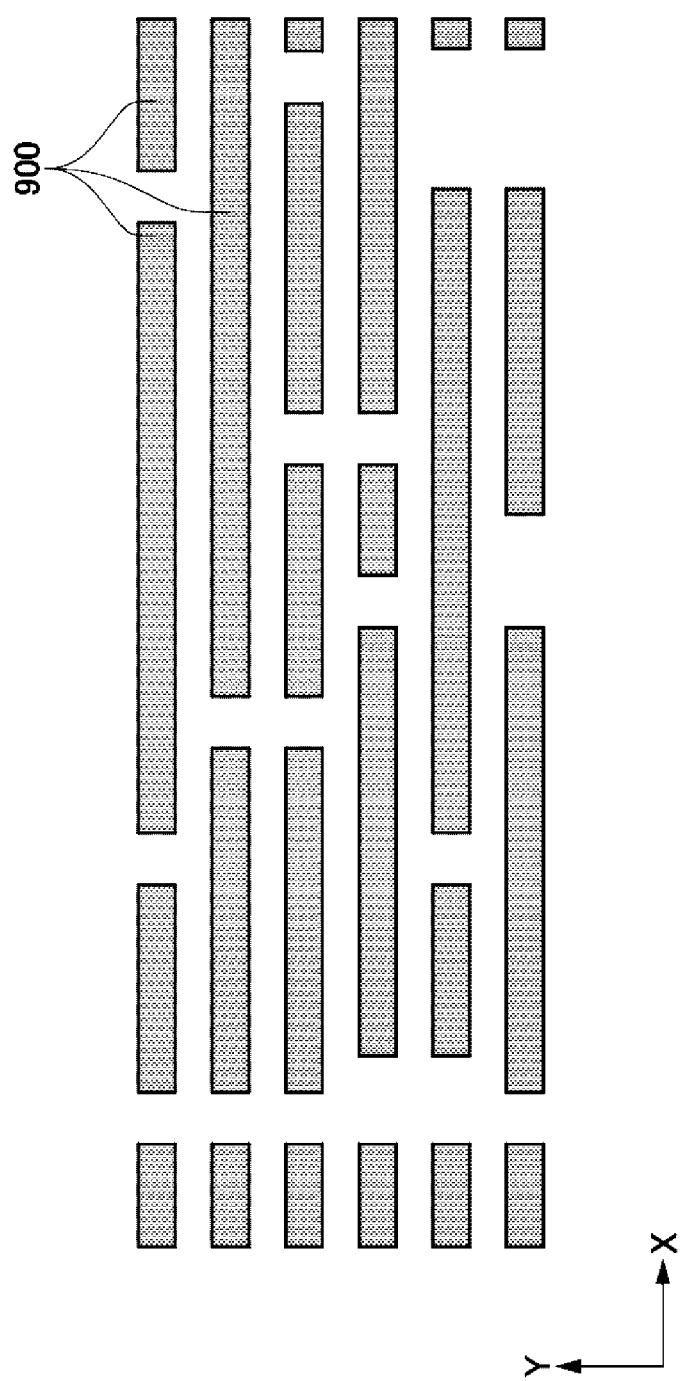
FIG. 9 shows an exemplary fine wire pattern 900 formed on the surface of the sample 10.

FIG. 9 shows an exemplary fine wire pattern 900 formed on the surface of the sample 10. With the exposure apparatus 100 according to the present embodiment, a finer wire pattern 900 can be formed by exposing the sample 10 on which the line pattern is formed in advance. For example, the line pattern 802 shown in FIG. 8 is a simple line and space pattern, and therefore it is possible to form the pattern with a line width and line interval of approximately 10 nm by using optical exposure technology. By using the exposure apparatus 100 according to the present embodiment that utilizes electron beams, this line pattern 802 can be machined, and therefore it is possible to form a fine wire pattern 900 that cannot be formed merely by optical exposure technology, such as a gate electrode. By using optical exposure technology to form the line pattern 802, it is possible to reduce the total machining time needed to form the fine wire pattern 900.

Furthermore, the coordinates of the cut pattern and the configuration of the irradiation position of the array beam 500 is based on the grid used for designing the line pattern 802, and therefore the exposure control section 140 can perform fine exposure with a simple control operation, without requiring complex feedback control. In the above description, the exposure apparatus 100 according to the present embodiment is described as an electron beam exposure apparatus that utilizes electron beams, but the present invention is not limited to this, and the present invention can be applied in the same manner to exposure apparatuses utilizing various types of charged particle beams. Furthermore, the present embodiment above describes an example of exposure of a cut pattern, but the present invention is not limited to this, and can be applied to the exposure of a via pattern in the same manner.

The exposure apparatus 100 according to the present embodiment describes an example of exposing the sample 10 on which is formed a line pattern having substantially the same line widths and the same line intervals. Instead, the exposure apparatus 100 may expose a sample 10 having formed thereon a line pattern with different line widths and line intervals. In a case where the line pattern is formed with different line widths and line intervals based on the grid, the exposure apparatus 100 can expose the line pattern at the designated irradiation position corresponding to this grid.

Figure 10:
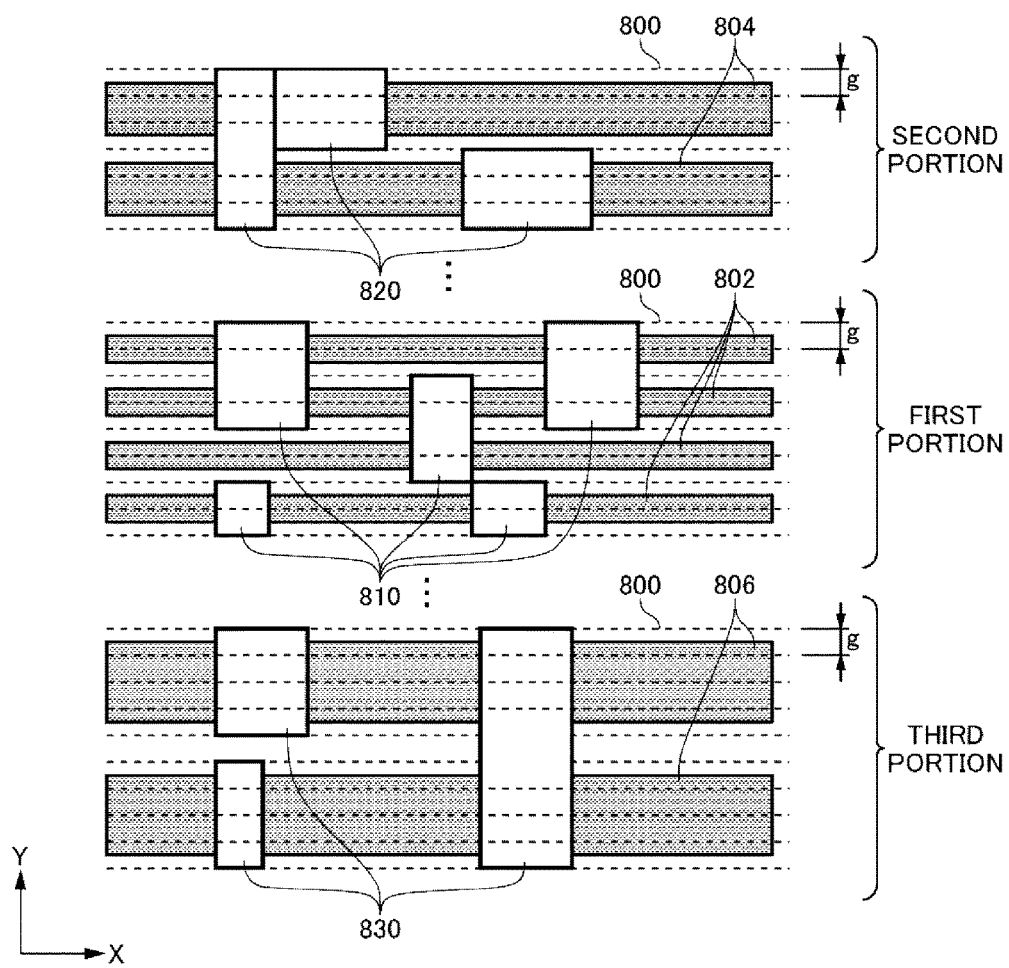
FIG. 10 shows an exemplary sample 10 on which is formed a line pattern having different line widths and different line intervals.

FIG. 10 shows an exemplary sample 10 on which are formed line patterns having different line widths and different line intervals. In this example, the sample 10 includes a first portion, and second portion, and a third portion, and the line patterns formed respectively in these portions have different line widths and different line intervals. In this way, even when a plurality of types of line patterns are formed on a single sample 10, each line pattern is designed using a common grid.

FIG. 10 shows an example in which the line pattern 802 of the first portion has a line width of g and a line interval of g, the line pattern 804 of the second portion has a line width of 2g and a line interval of g, and the line pattern 806 of the third portion has a line width of 3g and a line interval of 2g.

In this way, when the widths and the intervals of the line patterns are different, the sizes of the cut patterns 810, 820, and 830 corresponding respectively to these line patterns are also different. However, in a case where each line pattern is designed based on the same grid 800, the Y coordinates of each cut pattern can be expressed as discrete coordinates on the grid 800, as described in FIGS. 4 and 5. In this case, the irradiation positions of the electron beams correspond to a grid with intervals of g, and therefore the exposure apparatus 100 according to the present embodiment can perform exposure for such cut patterns.

Figure 11:
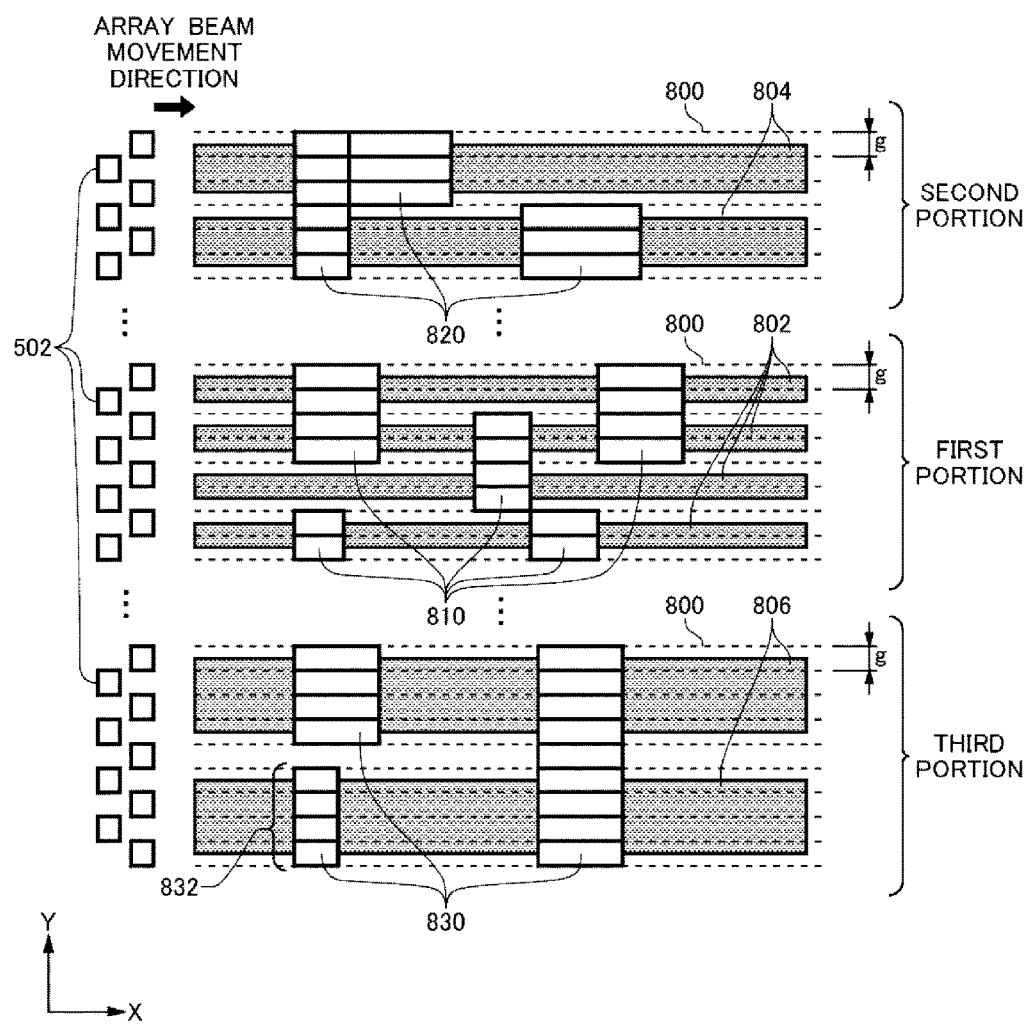
FIG. 11 shows an example in which the irradiation regions 502 of the electron beams according to the present embodiment are arranged in correspondence with the grid 800.

FIG. 11 shows an example in which the irradiation regions 502 of the electron beams according to the present embodiment are arranged in correspondence with the grid 800. Specifically, FIG. 11 shows an example in which the irradiation region of the electron beam Bn arranged as the n-th electron beam counting from the −Y direction side is arranged between the n-th and the (n+1)-th grid lines counting from the −Y direction side, as described in FIG. 5. As a result, when a cut pattern is positioned between the k-th and l-th grid lines, for example, the exposure apparatus 100 can expose this cut pattern by using the k-th to (l−1)-th electron beams.

In other words, in this case, the selecting section 160 selects at least one charged particle beam that is continuous in the width direction from among the plurality of charged particle beams, according to the width of the line pattern at the designated irradiation position. For example, according to the line pattern 802 of the first portion with a line width of g, the selecting section 160 selects two electron beams lined up in the width direction in the array beam in order to expose the cut pattern with a pattern width of 2g for cutting this line pattern 802.

As another example, according to the line pattern 804 of the second portion with a line width of 2g, the selecting section 160 selects three electron beams lined up in the width direction in the array beam in order to expose the cut pattern with a pattern width of 3g for cutting this line pattern 804. Similarly, according to the line pattern 806 of the third portion with a line width of 3g, the selecting section 160 selects four electron beams lined up in the width direction in the array beam in order to expose the cut pattern with a pattern width of 4g for cutting this line pattern 806. In this way, the selecting section 160 selects m+1 electron beams according to the line width of m×g.

As described in FIGS. 6 and 7, the selecting section 160 detects each irradiation position by determining the passed times corresponding to the selected electron beams. In this way, by controlling the radiation of the electron beams while scanning with the irradiation position of the array beam 500, the exposure control section 140 can expose each of the cut patterns 810, 820, and 830. In the example of FIG. 11 as well, the exposure apparatus 100 may scan with the array beam having a beam width of n×g corresponding to the number n of the electron beams, and may expose the sample 10 in each frame having a frame width corresponding to the beam width of n×g. In this way, the exposure apparatus 100 according to the present embodiment can expose the corresponding cut pattern by selecting the suitable electron beams corresponding to the irradiation positions, even when line patterns with different line widths and different line intervals are formed on the sample 10.

The exposure apparatus 100 according to the present embodiment is an example in which the sample 10 is irradiated by the electron beams selected by the selecting section 160 in a region of the cut patterns corresponding to the passed time. In addition to this, the exposure apparatus 100 may adjust the control signals for radiating the electron beams to adjust the exposure amount within the region of the cut patterns. Specifically, in a case where at least one charged particle beam is used to irradiate a range with a designated length in the longitudinal direction of the line pattern, the irradiation control section 170 changes the radiation amount of the at least one charged particle beam according to the irradiation position within this range.

Figure 12:
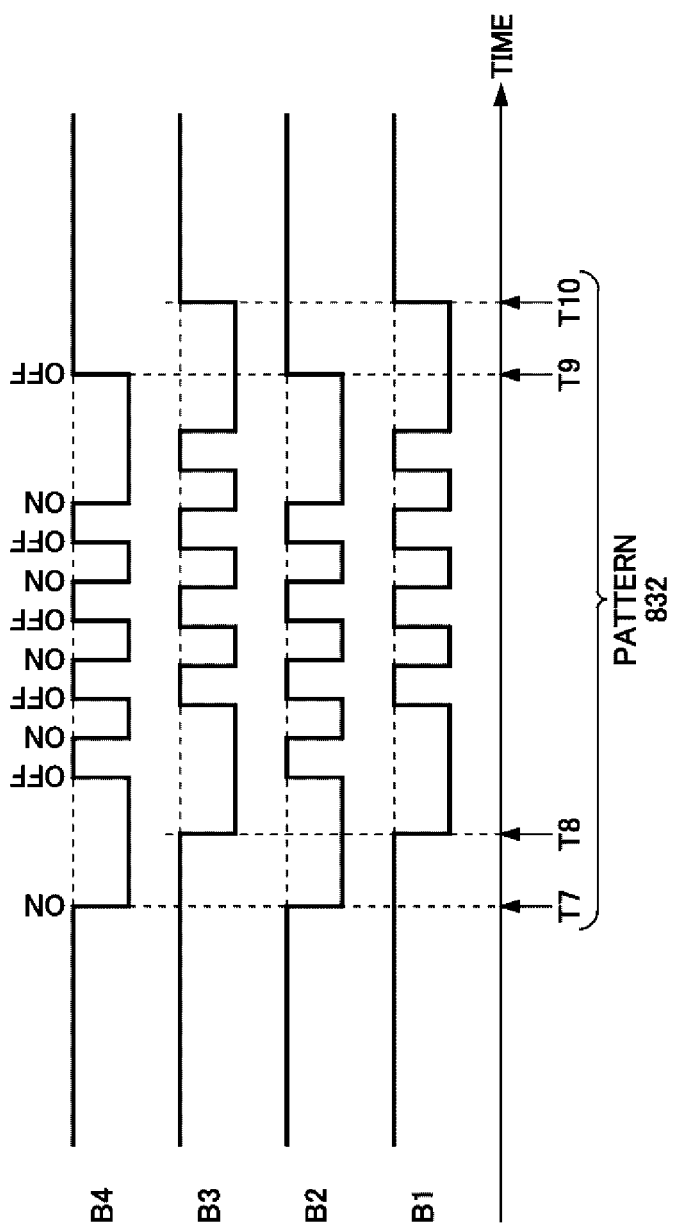
FIG. 12 shows examples of control signals for adjusting the exposure amount of a cut pattern generated by the irradiation control section 170 according to the present embodiment.

FIG. 12 shows examples of control signals for adjusting the exposure amount of a cut pattern generated by the irradiation control section 170 according to the present embodiment. In FIG. 12, the horizontal axis indicates time and the vertical axis indicates voltage, in the same manner as in FIG. 7. At the timing T7, the control signals B2 and B4 are switched form the high state to the low state in order to irradiate the sample 10 with the electron beams B2 and B4. Furthermore, at the timing T9, the control signals B2 and B4 are switched form the low state to the high state in order to stop the irradiation with the electron beams B2 and B4.

In the same manner, at the timing T8, the control signals B1 and B3 are switched form the high state to the low state in order to irradiate the sample 10 with the electron beams B1 and B3, and at the timing T10, the control signals B1 and B3 are switched form the low state to the high state in order stop the irradiation with the electron beams B1 and B3. Here, the time difference between the timing T7 and the timing T8 and the time difference between the timing T9 and the timing T10 are substantially equal to the time difference (δ/V) corresponding to the interval δ between the columns of electron beams. As a result, the electron beams B1 to B4 begin being radiated at substantially the same coordinates on the X axis, and stop being radiated at substantially the same coordinates on the X axis. In other words, the electron beams B1 to B4 are driven in a manner to expose the cut pattern 832 shown in FIG. 11, for example.

In this way, when exposing a cut pattern using a plurality of electron beams, the tendency of the boundary between exposure region to become less clear and more blurred is more pronounced when the exposure surface area of the exposure regions are larger. Therefore, the exposure apparatus 100 of the present embodiment may decrease the exposure amount by adjusting the control signals for radiating the electron beams, to reduce the unclearness of the boundaries between exposure regions.

In a case where a region with a designated length in the longitudinal direction of the line pattern is irradiated by at least one charged particle beam, the irradiation control section 170 changes whether at least one charged particle beam irradiates the sample 10 according to the irradiation position within this exposure range. For example, during the period between the timing T7 and the timing T9 when the sample 10 is being exposed and irradiated by the electron beams B2 and B4, the irradiation control section 170 repeatedly stops and starts the radiation of the electron beams B2 and B4. In the same manner, during the period between the timing T8 and the timing T10 when the sample 10 is being exposed and irradiated by the electron beams B1 and B3, the irradiation control section 170 repeatedly stops and starts the radiation of the electron beams B1 and B3.

In this way, the irradiation control section 170 can adjust the exposure amount of the entire exposure region by providing a period during which the radiation of the electron beams is stopped within the period during which the exposure is performed by radiating the electron beams. Here, the irradiation control section 170 may shift the timing at which the sample 10 is irradiated by two charged particle beams having the closest paths, from among the plurality of charged particle beams. For example, during a period when exposure is performed, the irradiation control section 170 performs control such that the period during which the radiation of the electron beam B1 is stopped and the period during which the radiation of the electron beam B2 is stopped do not temporally overlap. In this way, the irradiation control section 170 can disperse the positions that are not irradiated by electron beams within the exposure region, thereby stopping localized skewing of the irradiation amount of the electron beams.

Figure 13:
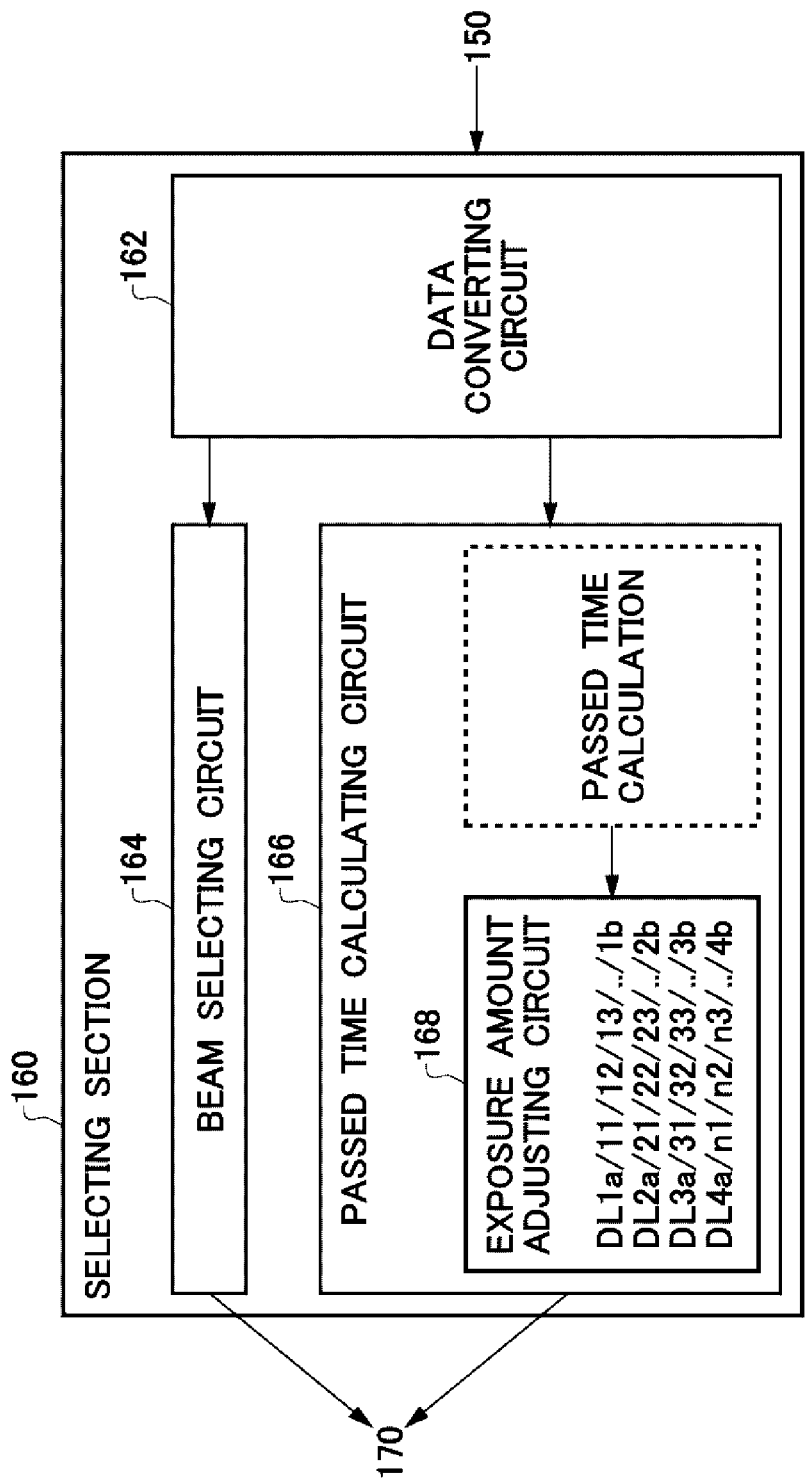
FIG. 13 shows an exemplary configuration of the selecting section 160 that performs the exposure amount control shown in the timing chart of FIG. 12.

FIG. 13 shows an exemplary configuration of the selecting section 160 that performs the exposure amount control shown in the timing chart of FIG. 12. In FIG. 13, components that have substantially the same operation as those of the selecting section 160 shown in the embodiment of FIG. 6 are given the same reference numerals and redundant descriptions are omitted. The passed time calculating circuit 166 shown in FIG. 13 further includes an exposure amount adjusting circuit 168 and, in addition to detecting the passed time in order to set the electron beams selected by the beam selecting circuit 164 to the ON state and the OFF state, calculates a passed time for controlling the exposure amount.

The passed time calculating circuit 166 calculates the passed times (DL1a, DL2a, DL3a, DL4a, DL1b, DL2b, DL3b, and DL4b) for setting the four electron beams B1, B2, B3, and B4 to the ON state and the OFF state, as shown in FIG. 12, for example, using Expression 1 and Expression 2. The exposure amount adjusting circuit 168 calculates the passed time for adjusting the exposure amount by further setting an electron beam to the OFF state and the ON state during the period from the passed time at which the electron beam is to be set to the ON state to the passed time at which the electron beam is to be set to the OFF state. With the passed times for adjusting the exposure amount set to be LD11, DL12, DL13, etc., the expressions shown below are fulfilled.

$$DL1a<DL11<DL12<DL13<\ldots<DL1b$$

$$DL2a<DL21<DL22<DL23<\ldots<DL2b$$

$$DL3a<DL31<DL32<DL33<\ldots<DL3b$$

$$DL4a<DL41<DL42<DL43<\ldots<DL4b \quad \text{Expression 3}$$

The passed time for adjusting the exposure amount depends on the resist material and the like as well, and therefore the exposure apparatus 100 preferably observes in advance the state of the boundaries of the exposure regions relative to the exposure amounts, and stores conditions for suitable exposure amounts in the storage section 150 or the like. Instead, the user may use the CPU 130 to input parameters corresponding to passed times for adjusting the exposure amounts, for example. In this way, the passed time calculating circuit 166 can calculate the passed time for adjusting the state of the boundaries of the exposure regions.

The exposure apparatus 100 according to the present embodiment described above switches whether an electron beam is deflected by the blanking section 60 according to the voltage supplied to the corresponding blanking electrode 64. One example of the blanking section 60 having this function is described below using FIG. 14.

Figure 14:
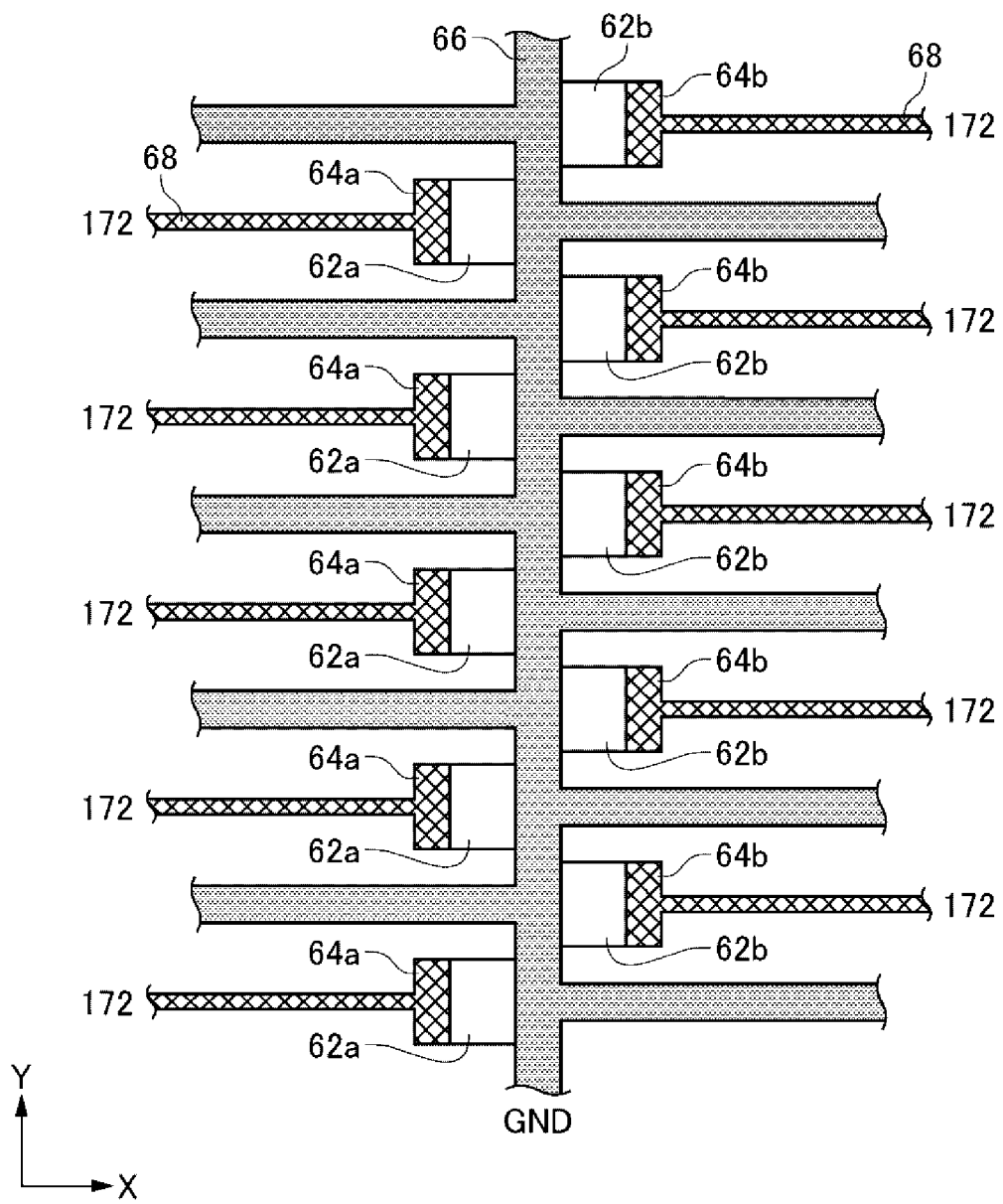
FIG. 14 shows an exemplary blanking section 60 according to the present embodiment.

FIG. 14 shows an exemplary blanking section 60 according to the present embodiment. The blanking section 60 includes a plurality of apertures 62, first blanking electrodes 64a, second blanking electrodes 64b, a common electrode 66, and electrode wires 68.

The apertures 62 each individually pass a corresponding one of the plurality of charged particle beams. The apertures 62 are preferably provided with a number of blanking sections 60 corresponding to the plurality of electron beams output as the array beam. In FIG. 14, the apertures 62 are divided into first apertures 62a and second apertures 62b in the X direction, which is a direction corresponding to the longitudinal direction of the line pattern. The first apertures 62a are a plurality of apertures 62 lined up in the Y direction, on the −X direction side, and are formed to correspond to the electron beams B1, B3, B5, and B7 shown in FIG. 5, for example. The second apertures 62b are a plurality of apertures 62 lined up in the Y direction, on the +X direction side, and are formed to correspond to the electron beams B2, B4, B6, and B8 shown in FIG. 5, for example.

Each first blanking electrode 64a is provided on the wall side of a first aperture 62a on the side opposite the common electrode 66. Each second blanking electrode 64b is provided on a wall surface of a second aperture 62b that is opposite the common electrode 66. The common electrode 66 is provided on a wall surface between the first apertures 62a and the second apertures 62b, in the X direction, and is an electrode shared by the first apertures 62a and the second apertures 62b. The common electrode 66 may be provided between each of the plurality of apertures 62 and the adjacent apertures 62 lined up in the Y direction.

Each electrode wiring 68 is connected to a first blanking electrode 64a and a second blanking electrode 64b, and to the irradiation control section 170 via a corresponding amplifier 172. The irradiation control section 170 changes the voltages of the first blanking electrodes 64a and the second blanking electrodes 64b according to the selection by the selecting section 160, to switch the electron beams to the ON state and the OFF state.

In the manner described above, the blanking section 60 includes a plurality of apertures 62 lined up in the Y direction in two columns, and therefore the Y-coordinate configuration of the apertures 62 can be arranged continuously while distancing the apertures 62 from each other with the common electrode 66. Therefore, the irradiation control section 170 can individually control each blanking electrode corresponding respectively to an aperture 62 by individually supplying voltage for switching the electron beam to the ON state and the OFF state to this blanking electrode. Furthermore, the plurality of electron beams passed by the plurality of apertures 62 can form an array beam in which the Y coordinates of the irradiation region are continuous. In other words, by scanning once with this array beam, it is possible to set the possible irradiation region of the array beam to be a frame in which the range of the electron beam irradiation is continuous along the Y coordinates extends in the X-axis direction that is the width of the frame.

The blanking section 60 according to the present embodiment described above includes a plurality of apertures 62 lined up in the Y direction in two columns, but instead, the blanking section 60 may include a plurality of apertures 62 lined up in the Y direction in three or more columns. In this case as well, the Y-coordinate configuration of the apertures 62 can be arranged continuously while distancing the apertures 62 from each other with the common electrode 66, and therefore the column section 120 can expose the surface of the sample 10 by scanning each frame with the array beam.

The exposure apparatus 100 according to the present invention described above is a single-column type of electron beam exposure apparatus that includes one column section 120, but the present invention is not limited to this, and the exposure apparatus 100 may include a plurality of column sections 120. An exposure apparatus 100 including a plurality of the column sections 120 is described below using FIG. 15.

Figure 15:
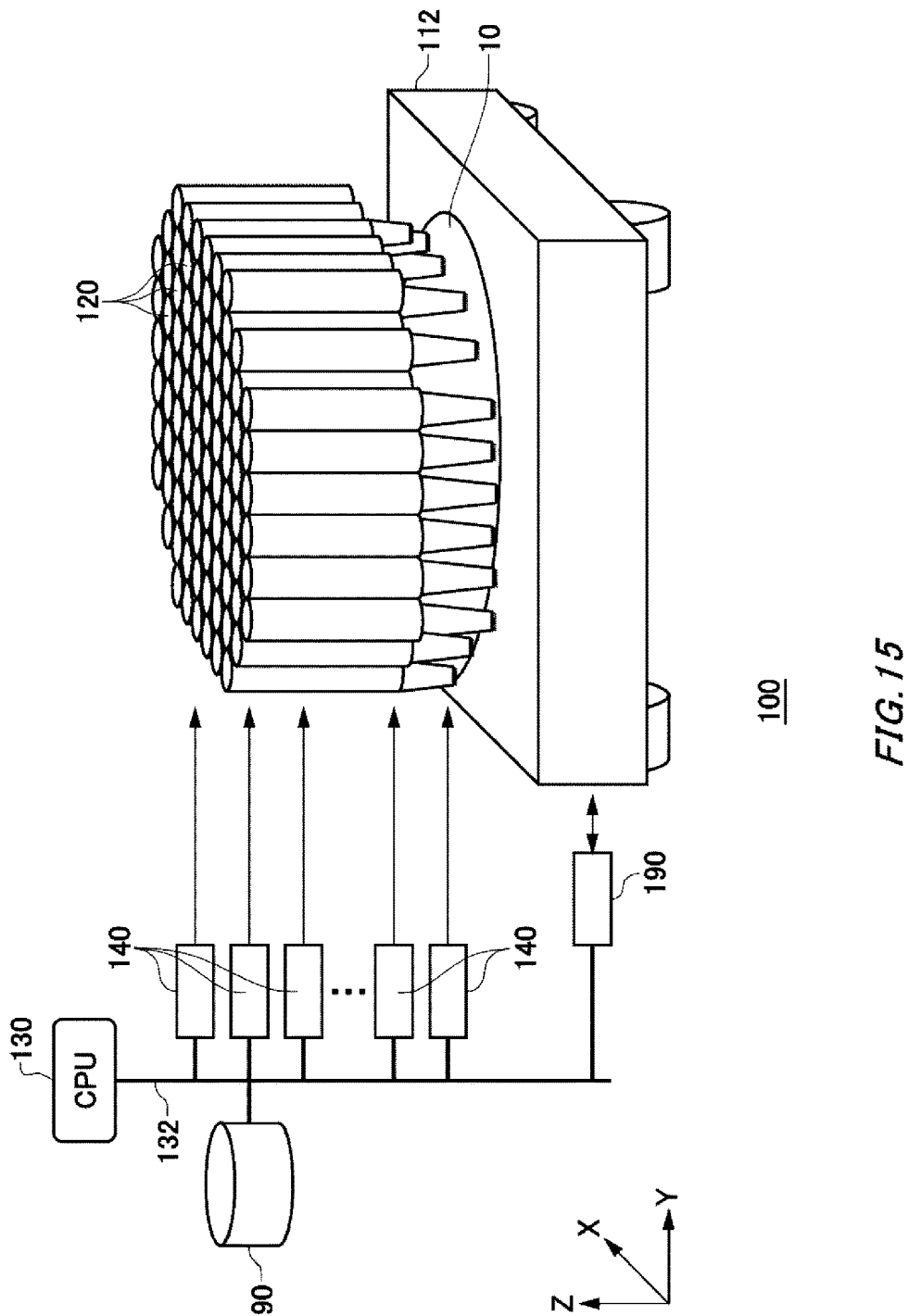
FIG. 15 shows a modification of the exposure apparatus 100 according to the present embodiment.

FIG. 15 shows a modification of the exposure apparatus 100 according to the present embodiment. In FIG. 15, components having substantially the same function as components of the exposure apparatus 100 according to the embodiment shown in FIG. 1 are given the same reference numerals, and redundant descriptions are omitted. The exposure apparatus 100 of the present modification includes a plurality of column sections 120 and a plurality of exposure control sections 140 that each include a selecting section 160, an irradiation control section 170, and a deflection amount determining section 180.

In the exposure apparatus 100 according to the present modification, in a case where the stage apparatus 112 is moved to perform scanning with the irradiation position of the array beam, it is not necessary for each exposure control section 140 to include the scanning control section 190. FIG.

15 shows an example including one stage section 110, a plurality of column sections 120 of the exposure apparatus 100, one CPU 130, a plurality of exposure control sections 140 that do not include the scanning control section 190, and one scanning control section 190.

Each column section 120 is connected to a corresponding exposure control section 140 and exposes the sample 10. The operation of each column section 120 includes exposing the possible irradiation region 200 in each frame, in the manner described in FIG. 3 and the like. The scanning control section 190 controls the stage section 110 to move the sample 10 mounted thereon relative to the plurality of column sections 120, and irradiates the sample 10 with charged particle beams in parallel from the plurality of column sections 120.

In this way, the electron beam exposure apparatus 100 of the present modification can perform the exposure in parallel with a plurality of column sections 120, and can therefore significantly improve the throughput of the exposure. Furthermore, even when the sample 10 is semiconductor wafer or the like with a large radius exceeding 300 mm, it is possible to prevent a significant decrease in the throughput by increasing the number of column sections 120 in accordance with the radius.

With the exposure apparatus 100 of the present modification, there are cases where the intensities of the plurality of array beams output by the plurality of column sections 120 differ. Therefore, before performing the exposure, the exposure apparatus 100 may measure in advance the intensities of the array beams output respectively from the column sections 120. Furthermore, the exposure apparatus 100 may correct the passed time for each exposure control section 140, such that there is no variation among the plurality of exposure results of the column sections 120. Yet further, the exposure apparatus 100 may position the array beam and line pattern of the chip being irradiated by the array beam for each column section 120, such that the column sections 120 respectively expose the cut patterns associated with different semiconductor chips on a single sample 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure apparatus that radiates a charged particle beam at a position corresponding to a line pattern that is formed on a sample in advance, comprising:
   a beam generating section that generates a plurality of the charged particle beams at different irradiation positions in a width direction of the line pattern;
   a scanning control section that performs scanning with the irradiation positions of the charged particle beams along a longitudinal direction of the line pattern;
   a selecting section that selects at least one charged particle beam to irradiate the sample from among the plurality of charged particle beams, at a designated irradiation position in the longitudinal direction of the line pattern; and
   an irradiation control section that controls the at least one selected charged particle beam to irradiate the sample.

2. The exposure apparatus according to claim 1, wherein the selecting section selects the at least one charged particle beam to be continuous in the width direction, from among the plurality of charged particle beams, according to the width of the line pattern at the designated irradiation position.

3. The exposure apparatus according to claim 1, further comprising:
   a stage section that has the sample mounted thereon and moves the sample, wherein
   the scanning control section moves the sample in the longitudinal direction of the line pattern using the stage section in a state where paths traveled by the charged particle beams are maintained.

4. The exposure apparatus according to claim 3, further comprising:
   a deflecting section that deflects the plurality of charged particle beams, wherein
   the scanning control section adjusts the paths traveled by the charged particle beams according to a movement error of the sample caused by the stage section.

5. The exposure apparatus according to claim 1, wherein the selecting section detects the designated irradiation position according to passed time that has passed from when the irradiation position of the plurality of charged particle beams passed through a predetermined reference position in the longitudinal direction of the line pattern.

6. The exposure apparatus according to claim 5, wherein the selecting section detects the designated irradiation position according to a most recent reference position passed by the irradiation position of the plurality of charged particle beams, from among a plurality of reference positions in the longitudinal direction of the line pattern, and the passed time that has passed since the irradiation position passed through the most recent reference position.

7. The exposure apparatus according to claim 1, wherein when the at least one charged particle beam irradiates a range with a designated length in the longitudinal direction of the line pattern, the irradiation control section changes an exposure amount of the at least one charged particle beam according to the irradiation position within the range.

8. The exposure apparatus according to claim 7, wherein the irradiation control section changes whether the at least one charged particle beam irradiates the sample, according to the irradiation position in the range.

9. The exposure apparatus according to claim 8, wherein the irradiation control section shifts a timing at which the sample is irradiated by two charged particle beams having the closest paths, from among the plurality of charged particle beams.

10. The exposure apparatus according to claim 1, further comprising:

a blanking section that switches whether each of the plurality of charged particle beams irradiates the sample, wherein the blanking section includes:

a plurality of apertures that individually and respectively pass the plurality of charged particle beams;

a common electrode that is provided between a wall surface of a first of the apertures and a wall surface of a second of the apertures with an orientation corresponding to the longitudinal direction of the line pattern, and is shared by the first aperture and the second aperture;

a first blanking electrode that is provided on a wall surface of the first aperture opposite the common electrode; and a second blanking electrode that is provided on a wall surface of the second aperture opposite the common electrode.

11. The exposure apparatus according to claim 10, wherein the irradiation control section changes voltages of the first blanking electrode and the second blanking electrode, according to a selection by the selecting section.

12. The exposure apparatus according to claim 1, comprising:

a plurality of the beam generating sections, a plurality of the selecting sections, and a plurality of the irradiation control sections, wherein the scanning control section moves the sample relative to the plurality of beam generating sections by controlling a stage section that moves the sample mounted thereon, and the sample is irradiated by the charged particle beams from the plurality of beam generating sections in parallel.

13. The exposure apparatus according to claim 1, wherein the irradiation control section controls the at least one selected charged particle beam to irradiate the sample to expose a cut pattern or a via pattern to the line pattern.

14. The exposure apparatus according to claim 1, wherein the line pattern includes a simple line and space pattern.

15. An exposure method for radiating a charged particle beam at a position corresponding to a line pattern on a sample, comprising:

forming the line pattern on the sample;

generating a plurality of the charged particle beams at different irradiation positions in a width direction of the line pattern;

scanning with the irradiation positions of the charged particle beams along a longitudinal direction of the line pattern;

selecting at least one charged particle beam to irradiate the sample from among the plurality of charged particle beams, at a designated irradiation position in the longitudinal direction of the line pattern; and controlling the at least one selected charged particle beam to irradiate the sample.

16. The exposure method according to claim 15, wherein the controlling the at least one selected charged particle beam includes controlling the at least one selected charged particle beam to irradiate the sample to expose a cut pattern or a via pattern to the line pattern.

17. The exposure method according to claim 15, wherein the forming the line pattern on the sample includes the forming a simple line and space pattern.

* * * * *